(12) United States Patent
Blednov

(10) Patent No.: US 7,332,961 B2
(45) Date of Patent: Feb. 19, 2008

(54) PREDISTORTION LINEARIZING

(75) Inventor: Igor Ivanovich Blednov, Nijmegen (NL)

(73) Assignee: NXP B.V., Eindhoven (NL)

( * ) Notice: Subject to any disclaimer, the term of this patent is extended or adjusted under 35 U.S.C. 154(b) by 137 days.

(21) Appl. No.: 10/531,932

(22) PCT Filed: Oct. 17, 2003

(86) PCT No.: PCT/IB03/04583

§ 371 (c)(1),
(2), (4) Date: Apr. 19, 2005

(87) PCT Pub. No.: WO2004/038910

PCT Pub. Date: May 6, 2004

(65) Prior Publication Data

US 2006/0033568 A1    Feb. 16, 2006

(30) Foreign Application Priority Data

Oct. 22, 2002 (EP) .................................. 02079392

(51) Int. Cl.
*H03F 1/26* (2006.01)
(52) U.S. Cl. .................... 330/149; 330/124 R
(58) Field of Classification Search .............. 330/53, 330/54, 84, 124 R, 149, 286, 295
See application file for complete search history.

(56) References Cited

U.S. PATENT DOCUMENTS

| | | | |
|---|---|---|---|
| 5,523,716 A | 6/1996 | Grebliunas et al. | |
| 5,576,660 A * | 11/1996 | Pouysegur et al. | ......... 330/149 |
| 5,703,530 A | 12/1997 | Sato et al. | |
| 5,703,531 A * | 12/1997 | Vaughn et al. | ............. 330/149 |
| 5,798,854 A | 8/1998 | Blauvelt et al. | |
| 5,966,049 A | 10/1999 | Yuen et al. | |
| 6,018,266 A | 1/2000 | Wu | |
| 6,147,553 A | 11/2000 | Kolanek | |
| 6,211,734 B1 * | 4/2001 | Ahn | ........................... 330/149 |
| 6,255,908 B1 | 7/2001 | Ghannouchi et al. | |
| 6,538,509 B2 * | 3/2003 | Ren | ........................... 330/149 |

FOREIGN PATENT DOCUMENTS

EP    1098435 A1    5/2001

* cited by examiner

*Primary Examiner*—Khanh Van Nguyen
(74) *Attorney, Agent, or Firm*—Peter Zawilski

(57) ABSTRACT

A method for a predistortion linearization of a branched signal for a RF amplifier, comprising supplying a branched signal to at least one input terminal (2); distributing power of the input signal present on at least one input terminal (2) to a plurality of parallel branch-circuits (16, 18, 20) as a branched signals by a power distributing circuit (4); controlling a phase parameter and an amplitude parameter of the branched signals by at least one nonlinear branch-circuit (18, 20); controlling a phase parameter and an amplitude parameter of the branched signals by at least one linear branch-circuit (16); combining output branched signals of at least one nonlinear branch circuit (18, 20) with the output branched signals of at least one linear branch circuit (16) by a power combining circuit (12); providing an output branched signal of the power combining circuit (12) on at least one output terminal (14). Furthermore, a circuit for a predistortion unit linearizing a signal for a RF amplifier and a layout of a predistortion linearization of a signal for a RF amplifier are disclosed.

13 Claims, 21 Drawing Sheets

PREDISTORTION LINEARIZING

The present invention relates to a predistortion linearization, in particular to a method, and an electronic device comprising a circuit for a predistortion linearization.

U.S. Pat. No. 5,523,716 discloses a predistortion linearizer and a method for distorting an AC input branched signal to a power amplifier providing a distortion to the input branched signal which is complementary to a distortion in terms of gain and phase, introduced by the power amplifier as a function of the branched signal amplitude, thereby to linearize the power amplifier. The linearizer includes a switching circuit having an input terminal and an output terminal and a pair of anti-parallel diodes connected between the input terminal and the output terminal of the switching circuit The linearizer also has an impedance circuit comprising solely passive electrical elements connected between the input terminal and the output terminal of the switching circuit, wherein elements of the impedance circuit have values selected to introduce the complementary distortion to the input branched signal as a function of the amplitude of the input branched signal to linearize the power amplifier.

U.S. Pat. No. 5,703,530 describes a radio-frequency amplifier circuit of simple construction having low power consumption and low heat generation and amplifying an input branched signal while maintaining composite triple beat (CTB) distortion, type cross modulation distortion, at a minimum. The radio-frequency amplifier comprises a transformer which transforms an input branched signal from an unbalanced state to a balanced state. The amplifier further comprises at least one distortion generation circuit including a first circuit having a nonlinear element and a first delay line coupled in series, and a second circuit having an attenuation element and a second delay line coupled in series. The first and second circuits are coupled in parallel. At least one distortion generation circuit is coupled to an input, an output and/or an function point of a radio-frequency amplification stage of the radio-frequency amplifier. The first and second delay lines are configured to create a delay time change in a branched signal input level of a branched signal input to the radio-frequency amplification stage which opposes a delay time change in the branched signal input level caused by a delay time difference between the input and output of the radio-frequency amplification stage. A transformer transforms the amplified input branched signal from the balanced state back to an unbalanced state before outputting the amplified branched signal from the amplifier circuit.

U.S. Pat. No. 5,798,854 discloses an electronic circuit providing a linear output from a nonlinear transmission device such as a laser. Second and higher order distortion of the nonlinear device is compensated by applying a predistorted branched signal equal in magnitude and opposite in sign to the real and imaginary components of distortion produced by the nonlinear device. The input branched signal for the nonlinear device is applied to an in-line electrical path coupled to the nonlinear device. The in-line path contains at least one component for generating primarily real components of distortion. In some applications, at least one component for generating imaginary components of distortion is located on the in-line path. Filter stages are used to provide frequency dependent predistortion. In a preferred embodiment, an attenuator, an MMIC amplifier, a CATV hybrid amplifier, and a varactor in line with a semiconductor laser, provide the predistorted branched signal. In another embodiment, the real component of predistortion is generated by a FET configured as a voltage controlled resistor. In still another embodiment, the real component of predistortion is generated by the parallel combination of a diode and a resistor connected in series with the RF branched signal path. Also provided is a separate circuit including anti-parallel diodes and reactive elements for generating frequency dependent third-order predistortion.

U.S. Pat. No. 5,966,049 discloses a broadband linearizer for use with a power amplifier. The broadband linearizer includes a broadband linearizer bridge, a preamplifier/attenuator, a post amplifier/attenuator, and a control circuit. The broadband linearizer bridge includes a power divider and a power combiner interconnected by linear and nonlinear arms. The linear arm has a phase shifter, a passive equalizer, and a first delay line that are serially coupled together. The nonlinear arm has a distortion generator, an attenuator and a second delay line that are serially coupled together. 9II~hc control circuit controls respective settings of the broadband linearizer bridge, preamplifier/attenuator and post amplifier/attenuator. The control circuit provides bias circuitry and sends command and telemetry branched signals to control operation of the broadband linearizer. The broadband linearizer provides for independent, flexible gain and phase control that can match with different kinds of power amplifiers having varied gain and phase performance.

U.S. Pat. No. 6,018,266 describes a radio-frequency system including a reflective diode linearizer. The reflective diode linearizer has a quadrature hybrid circuit with an input, an output, a first tuned port, and a second tuned port. Each of the tuned ports has a reflection circuit in electrical communication. Each reflection circuit includes a first Schottky diode having a cathode in electrical communication with the tuned port, a second Schottky diode having an anode in electrical communication with the tuned port, a first delay line having a first end in electrical communication with the tuned port, a second delay line having a first end in electrical communication with an anode of the first Schottky diode and also in electrical communication with a cathode of the second Schottky diode, and a radio-frequency resistive element having a first end in electrical communication with a second end of the first delay line and a second end in electrical communication with a second end of the second delay line and with an electrical ground.

U.S. Pat. No. 5,523,716, U.S. Pat. No. 5,703,530, U.S. Pat. No. 5,798,854, and U.S. Pat. No. 5,966,049 suggest means for amplitude adjustment of the branched signal incident on the input terminal of a distortion circuit and means for amplitude adjustment of the branched signal output by an output terminal of the distortion circuit. The solutions of these patents make use of two main elements: conventional, single-ended or push-pull type, amplifiers; and distortion generation circuit made of two parallel branch-circuits including time delay and power dissipating components one of which is a nonlinear impedance branch-circuit with nonlinear device and another is usually a linear passive branch-circuit. The distortion generator circuits have several disadvantages, when used. They do not provide the isolation between branch-circuits so the tuning of one of the branch-circuits is effecting the performance/delay time, impedance and transmission parameters/of others parallel branch-circuits. They do not provide the required rate of gain/phase expansion or AM/AM/AM/PM in case of deep saturation of one amplification stage or required characteristic of AM/AM and AM/PM vs. input/output power in case of a multistage amplifier. Furthermore, they show high RF branched signal losses (more than −15 dB), to achieve the required higher AM/PM and AM/AM regulation rate.

U.S. Pat. No. 6,018,266 describes a predistortion circuit where the key elements are the hybrid and diodes and where the main principle is a reflection of the branched signal from the diodes, connected to the hybrid ports, where the branched signal is going through the hybrid from the input port to the diodes and then reflected back to the other hybrid output port.

It is an object of the present invention to provide a method, and an electronic device comprising a circuit for a predistortion linearization.

To achieve the object of the present invention, a method for a predistortion linearization of a branched signal for a RF amplifier is disclosed, comprising supplying an input signal to at least one input terminal; distributing the input signal present on at least one input terminal to a plurality of parallel branch-circuits as branched signals by a power distributing circuit; controlling a phase parameter and/or an amplitude parameter of the branched signals by at least one nonlinear branch-circuit; controlling a phase parameter and/or an amplitude parameter of the branched signals by at least one linear branch-circuit; combining output signals of at least one nonlinear branch circuit with the output signals of at least one linear branch by a power combining circuit; providing a final output signal of the predistortion unit from the power combining circuit on at least one output terminal. The method of the present invention increases the AM/AM and AM/PM expansion rate. That is enabled by using parallel branches of linear and nonlinear branches, wherein the parallel branches comprise an amplification element. The AM/AM rate and the AM/PM rate are separately controlled.

According to a preferred embodiment of the invention, the controlling of a phase parameter and/or an amplitude parameter of a branched signal by at least one nonlinear branch-circuit comprises controlling a phase of a branched signal by at least one phase control unit and/or; controlling an amplitude of a branched signal by at least one linear amplitude control unit and/or; controlling an amplitude of a branched signal by at least one nonlinear amplitude control unit. The AM/AM rate is controlled by the nonlinear branch. This provides the possibility of controlling the AM/AM rate separately from the AM/PM rate.

According to a preferred embodiment of the invention, the controlling of a phase parameter and/or an amplitude parameter of a branched signal by at least one linear branch-circuit comprises controlling a phase variation of a branched signal by at least one phase control unit and/or; controlling an amplitude of a branched signal by at least one linear amplitude control unit. The linear branch controls the AM/PM rate separately from the AM/AM rate.

According to a preferred embodiment of the invention, the linear and/or the nonlinear amplitude control unit is controlled depending on a power level of an input signal. This advantageous feature allows that each branch starts with the regulation of its parameter depending on a power level of the input signal. This provides the possibility of each branch being adapted to a special power level of the input signal.

According to a preferred embodiment of the invention, the linear and/or the nonlinear amplitude control unit are controlled depending on an external adjustable value. This advantageous feature makes it possible to adjust a value, from which the regulation of each branch depends.

According to a preferred embodiment of the invention, the linear and/or the nonlinear branch-circuit has its own specific RF power level from which its predistortion of amplitude and/or phase starts, which is defined by an individual nonlinear function.

To achieve the object of the present invention, a method for a predistortion linearization is disclosed, where the elements such as a varicap and a gain controlled amplifier can be used in particular for AM/AM and AM/PM temperature compensation of a linearized power module, comprising supplying an input signal to at least one input terminal; distributing the input signal present on at least one input terminal to a plurality of parallel branch-circuits as branched signals by a power distributing circuit; controlling a phase parameter and/or an amplitude parameter of the branched signals by at least one nonlinear branch-circuit; controlling a phase parameter and/or an amplitude parameter of the branched signals by at least one linear branch-circuit; combining output signals of at least one nonlinear branch circuit with the output signals of at least one linear branch by a power combining circuit; providing a final output signal of the predistortion unit from the power combining circuit on at least one output terminal.

To achieve the object of the present invention, an electronic device comprising a circuit for a predistortion unit linearizing a signal for a RF amplifier are disclosed, comprising at least one input terminal; a power distributing circuit distributing an input signal present on at least one input terminal to a plurality of parallel branch-circuits as branched signals; at least one nonlinear branch-circuit controlling a phase parameter and/or an amplitude parameter of the branched signals; at least one linear branch-circuit controlling a phase parameter and/or an amplitude parameter of the branched signals; a power combining circuit combining output signals of at least one nonlinear branch circuit with the output signals of at least one linear branch circuit; at least one output terminal providing an output signal of the predistortion unit from the power combining circuit. The advantageous feature of the circuit and the layout is that the present invention cancels more than 20 dB of the third-order inter-modulation. Minimizing the third-order inter-modulation is very important for wireless communication systems with digital modulation, such as WCDMA and EDGE. The circuit is very suitable for use in combination with a multistage power amplifier. The circuit can be used for a wide variety of power amplifiers, due to almost independent adjustability of AM/AM and AM/PM regulation rates and threshold power level. The circuit can be embodied in a semiconductor device, or as a circuit on a carrier such as a printed circuit board. The electronic device is preferably a module comprising a power amplifier and the circuit. Such module can for instance be used in portable communication devices, such as a mobile phone.

According to a preferred embodiment of the invention, the nonlinear branch-circuit comprises at least one phase control unit controlling the phase of a branched signal and/or; at least one linear amplitude control unit controlling the amplitude of a branched signal and/or; at least one nonlinear amplitude control unit controlling the amplitude of a branched signal. The advantageous feature of the one linear branch circuit is that the AM/AM rate is regulated separately from the AM/PM rate.

According to a preferred embodiment of the invention, the linear branch-circuit comprises at least one phase control unit controlling the phase of a branched signal and/or; at least one linear amplitude control unit controlling the amplitude of a branched signal.

According to a preferred embodiment of the invention, the nonlinear amplitude control unit comprises at least one nonlinear element; and at least one amplifier.

According to another embodiment, the power combining circuit comprises a feedback. This feedback is present between the output and the input of the amplifier in the power combining circuit. Particularly, it is a double negative feedback, including a voltage feedback and a current feedback. In addition, each of the branches is provided with an output impedance. Such output impedance is advantageously embodied with resistors, which for instance an resistance between 10 and 100 Ohm. Due to this feedback the input impedance of the combining circuit can be relatively low.

The advantage of this embodiment is that its enables a modular approach. The embodiment provides a good isolation between the branches. Therewith a branch can be modified without having the influence thereof in the other branches. Alternatively parallel branches may be added or removed. This enables modification of the concept for different applications. Basically the circuit is suitable for all applications at high frequencies, that need a good linearity and a high power level. The predistortion circuitry may give a correction of about 3 dB per amplifier stage, and more than one predistortion circuit can be applied in a mulistage amplifier.

More precisely, the power amplifier characteristics in a saturation region have rather non-linear behaviour and are more or less unique for a specific amplifier. The amplifier is therein dependent on the used power transistors, the matching technique and the quantity of amplifier stages. The predistor characteristics—i.e. the AM/AM and AM/PM characistics—should thus be fitted for each individual case. Conventional power combining circuits such as Hybrid, Wilkinson, Lange and ratrace couplers, usually require a large area and have nonetheless a limited frequency band. Alternative combining circuits are implemented with lumped elements, but also these have the disadvantage of a large area. Additionally, many lumped elements are needed and this implementation is not very suitable for IC design.

These drawbacks are solved by the use of an amplification technique with feedback and particularly with double negative feedback. As advantages can be mentioned that the control of gain and input impedance is easy; that it results in a high linearity or in other words that the intermodulation distortion is adequately compensated; that it has a good temperature stability and that it is applicable for wide bands. Moreover, is the embodiment easily implementable in IC design and is only a limited surface area required. The advantageous feature of the linear branch circuit is that the AM/PM rate is regulated separately from the AM/AM rate.

According to a preferred embodiment of the invention, the nonlinear element is a diode.

According to a preferred embodiment of the invention, the nonlinear element is a circuit of anti-parallel connected diodes.

According to a preferred embodiment of the invention, a control backward biasing unit is connected to the circuit of anti-parallel connected diodes.

According to a preferred embodiment of the invention, the nonlinear element is a transistor.

According to a preferred embodiment of the invention, the amplifier is a gain control amplifier.

According to a preferred embodiment of the invention, the amplifier has its own amplifier class.

According to a preferred embodiment of the invention, the amplifier is an A- or AB- or B- or C- or E- or F-class amplifier.

According to a preferred embodiment of the invention, the linear amplitude control unit is a gain control amplifier and/or an attenuator and/or a resistor and/or a dissipative transmission line and/or a controllable resistive component.

According to a preferred embodiment of the invention, the amplifier has its own amplifier class.

According to a preferred embodiment of the invention, the amplifier is an A- or AB- or C- or E- or F-class amplifier.

According to a preferred embodiment of the invention, the amplifier comprises at least one transistor.

According to a preferred embodiment of the invention, the phase control unit comprises at least one transmission line.

According to a preferred embodiment of the invention, the transmission lines are connected in parallel and/or in series.

According to a preferred embodiment of the invention, the transmission line is a quarter-wavelength transmission line.

According to a preferred embodiment of the invention, the transmission line is artificial and/or distributed.

According to a preferred embodiment of the invention, the transmission line is an impedance transformation circuit and/or a filtering circuit and/or a phase shifter circuit.

According to a preferred embodiment of the invention, the transmission line comprises a serial and/or a parallel circuit of at least one resistor and/or capacitance and/or inductance.

According to a preferred embodiment of the invention, the phase control unit comprises at least one controlled resistive element.

According to a preferred embodiment of the invention, the controlled resistive element is connected between ground and a connection point of at least two transmission lines.

According to a preferred embodiment of the invention, the controlled resistive element is connected between ground and at least one terminal of the amplifier of the linear amplitude control unit and/or the nonlinear amplitude control unit.

According to a preferred embodiment of the invention, a control input of the controlled resistive element is connected to at least one terminal of the amplifier of the linear amplitude control unit and/or the nonlinear amplitude control unit.

According to a preferred embodiment of the invention, the linear and/or the nonlinear branch-circuit has a filtering circuit at an output terminal.

According to a preferred embodiment of the invention, the filtering circuit is a low-pass filter or a high-pass filter.

According to a preferred embodiment of the invention, the filtering circuit comprises a serial and/or a parallel circuit of at least one resistor and/or at least one capacitance and/or at least one inductance.

According to a preferred embodiment of the invention, the circuit is integrated in a semiconductor circuit.

According to a preferred embodiment of the invention, the circuit is implemented in MMIC circuit technology.

These and various other advantages and novelty features which characterize the present invention are pointed out with particularity in the claims annexed hereto and forming part hereof. However, for a better understanding of the invention, its advantages, and the object achieved by its use, reference should be made to the drawings which form a further part hereof, and to the accompanying descriptive matter in which preferred embodiments of the present invention are illustrated and described.

Figure 1:
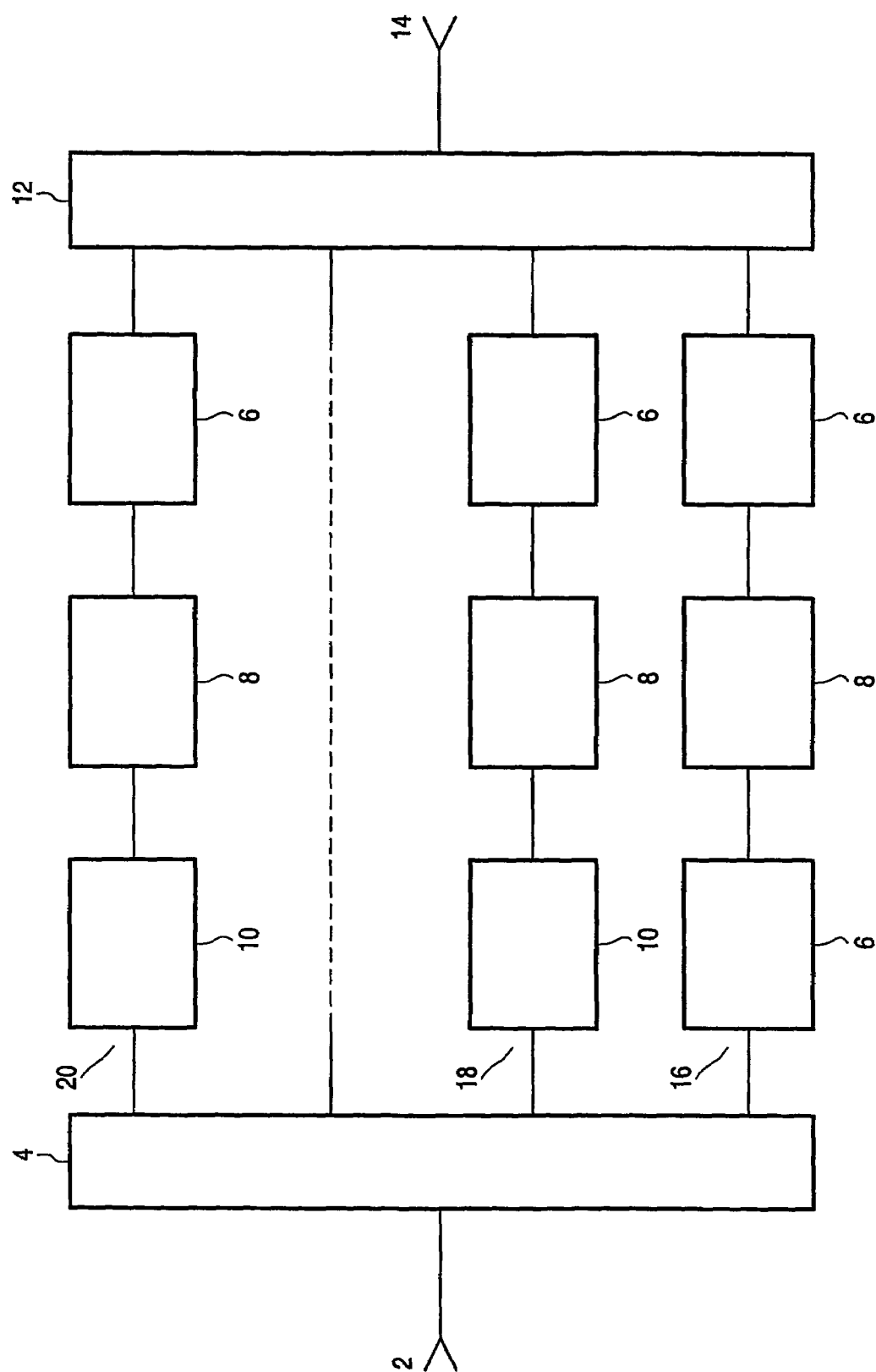
FIG. 1 shows a basic block diagram of the predistortion linearizer of the present invention.

FIG. 1 shows a basic block diagram of the present invention of a predistortion linearizer. Equivalent parts have equivalent numbers. This is done in the whole description of the present invention. The basic block diagram of FIG. 1 comprises an input terminal 2 connected to a power distribution circuit 4. The power distribution circuit 4 is connected to the parallel branches 16, 18 and 20. Branch 16 represents the first linear branch, branch 18 represents the first nonlinear branch, and branch 20 represents the $n^{th}$ nonlinear branch. The branch 16 comprises a phase control unit 6, also called transmission line unit, connected on one side to the power distribution circuit 4 and on the other side to a linear amplitude control unit 8. The linear amplitude control unit 8 is connected on the other side to another phase control unit 6. The phase control unit 6 is connected on the other side to a power combiner circuit 12.

The branch 18 is connected in parallel to the branch 16 between the power distribution circuit 4 and the power combiner circuit 12. The branch 18 comprises a serial circuit of a nonlinear amplitude control unit 10 connected on the one side to the power distribution circuit 4 and on the other side to a linear amplitude control unit 8. The linear amplitude control unit 8 is connected on the other side to phase control unit 6. The phase control unit 6 connected on the other side to the power combiner circuit 12.

The branch 20 is the $n^{th}$-branch of this block diagram. The branch 20 is connected in parallel to the branches 16 and 18 between the power distribution circuit 4 and the power combiner circuit 12. The branch 20 comprises a serial circuit comprising a nonlinear amplitude control unit 10 connected on the one side to the power distribution circuit 4 and on the other side to a linear amplitude control unit 8. The linear amplitude control unit 8 is connected on the other side to a phase control unit 6. The phase control unit 6 is connected on the other side to the power combiner circuit 12. The power combiner circuit 12 is connected to the output terminal 14.

The predistortion unit of the embodiments of the invention include several parallel branches which generate a predistortion signal at different levels of input power, while providing also a different predistortion rate which provides a better compensation of gradually changing rate of AM/AM and AM/PM in the power amplifier.

Figure 2:
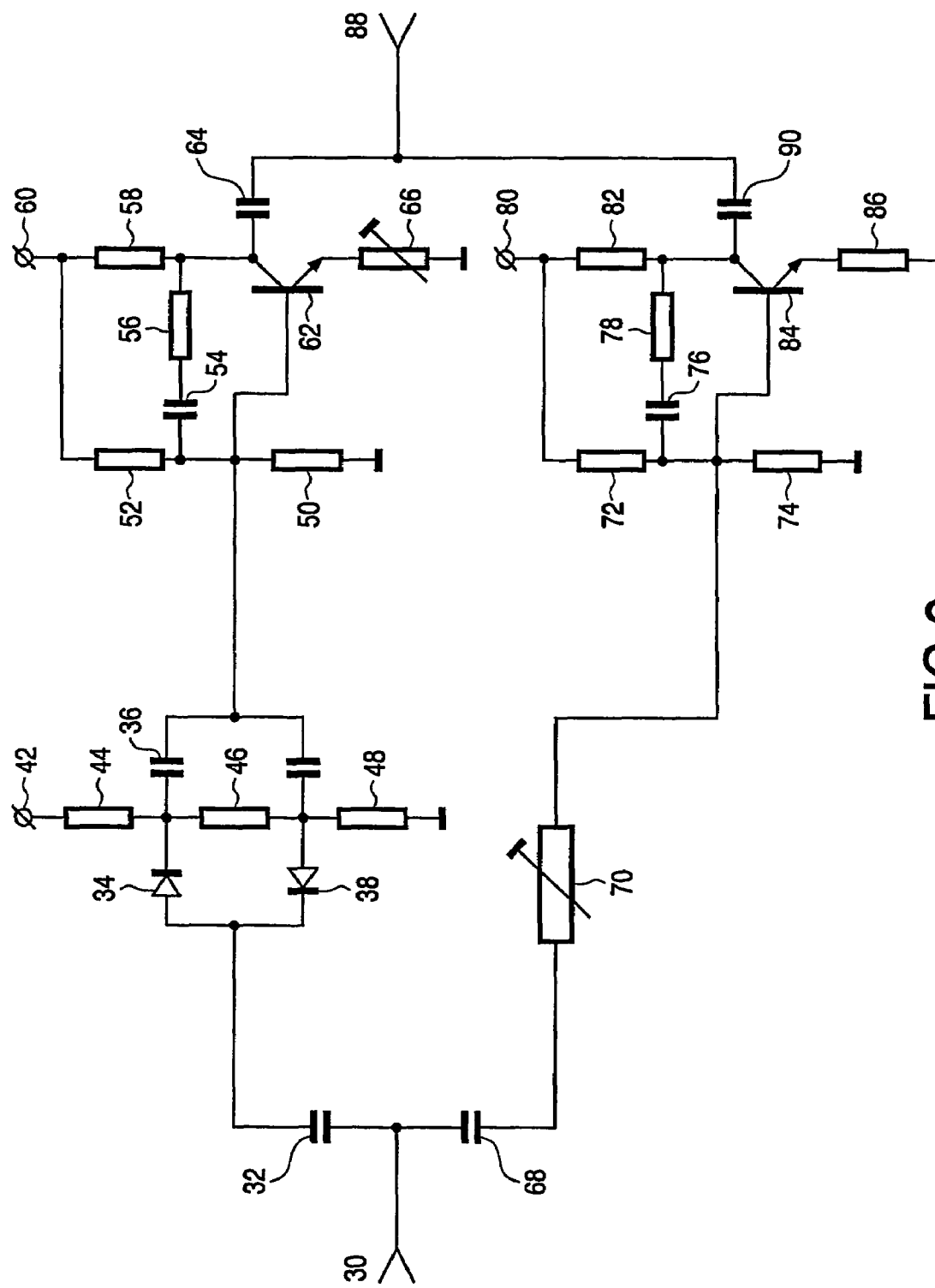
FIGS. 2 to 6 show a circuit diagram and graphs of an embodiment of the present invention.

FIG. 2 shows a possible embodiment of the present invention. The embodiment comprises an input terminal 30 connected to the capacitances 32 and 68. The other side of the capacitance 32 is connected to an anode of diode 34 and to a cathode of diode 38. The cathode of diode 34 is connected to a resistor 44, a resistor 46 and a capacitance 36. The other side of resistor 44 is connected to terminal 42. The anode of diode 38 is connected to the other side of resistor 46, to a capacitance 40, and to a resistor 48. The other side of the resistor 48 is connected to ground. The other side of the capacitance 40 is connected to the other side of capacitance 36 and to a resistor 50, a base terminal of transistor 62, a resistor 52 and a capacitance 54. The other side of the resistor 52 is connected to terminal 60. The other side of resistor 50 is connected to ground. The other side of capacitance 54 is connected to a resistor 56. The other side of the resistor 56 is connected to a resistor 58 and a collector terminal of transistor 62. The other side of the resistance 58 is connected to terminal 60. The collector terminal of transistor 62 is connected to the resistors 56, 58 and a capacitance 64.

An emitter of the transistor 62 is connected to an adjustable resistor 66. The other side of the resistor 66 is connected to ground. The other side of the capacitance 64 is connected to an output terminal 88. The other side of the capacitance 68 is connected to a delay line 70, which is adjustable. The other side of the delay line 70 is connected to a resistor 74, a resistor 72, a capacitance 76, and a base terminal of transistor 84. The other side of the resistor 74 is connected to ground. The other side of the resistor 72 is connected to a terminal 80. The other side of the capacitance 76 is connected to a resistor 78. The other side of the resistor 78 is connected to a resistor 82, a capacitance 90, and a collector terminal of the transistor 84. The other side of the capacitance 90 is connected to the output terminal 88. The emitter terminal of the transistor 84 is connected to a resistor 86. The other side of the resistor 86 is connected to ground.

This embodiment comprises only two branches for simplicity. There are a nonlinear branch and a linear branch. The nonlinear branch is the upper branch shown in FIG. 2 with a threshold regulation circuit comprising the elements 34 to 48 and an amplifier stage comprising the elements 50 to 66. The linear branch comprises a delay line 70 of any type and a linear amplifier stage comprising the elements 72 to 86.

The amplifier stage of the transistor 62 provides the gain, which compensates the signal losses in the threshold control circuit, which is created by the diodes 34 and 38. The gain of the amplifier stage is defined by the values of the feedback resistors 56 and 66 and may achieve an attenuation value of (1 ... 10)dB. When tuning the value of the resistor 66 in the emitter of transistor 62 from 0 to 4 Ohm, the gain of the amplifier stage varies from 4 to 10 dB, providing an almost independent AM/AM rate regulation, where the AM/PM rate is constant relative to the resistor 66, which is shown in the FIGS. 3 and 4.

The amplifier stage in the linear branch has lower gain and is advantageous for providing good isolation of the delay line from the nonlinear branch and regulation of the initial value of the transmission coefficient of the predistortion unit of this embodiment.

Providing additional nonlinear parallel branches, the required AM/AM and AM/PM characteristic shapes can be achieved in this embodiment without degrading of the original parameters, due to the properties of the amplifiers to isolate the output of every branch from others, provided that the parameter S12 of the amplifier is less than −10 dB.

In summary, the specific embodiment of the present invention described above comprises a linear branch and at least one nonlinear branch, which is connected in parallel to the linear branch. The nonlinear branch comprises an amplifier stage of an amplifier in A-class and a threshold power control unit with independent biasing. The nonlinear branch controls the AM/AM rate. The linear branch also comprises an amplifier stage and a control unit with controlled bias in the linear branch. The control unit, for example a delay line, controls the AM/PM rate. The amplifier stage comprises an A-class amplifier. The linear branch controls the AM/PM rate.

In the embodiment of the present invention described above, there is an amplification element inside the parallel branches which in fact radically increases the AM/AM and AM/PM expansion rate and provides the isolation between said parallel branch outputs when combined, which helps for independent tuning and adjustment of said parallel branch parameters.

The embodiment of the present invention described above also gives a solution for control of the threshold power level, such as anti-parallel diodes with independent biasing, whereby in this embodiment terminal 42 and an A-class amplifier, or a B-/C-class amplifier with controlled bias in one independent nonlinear branch, the threshold level, the input power level, above which the amplitude and phase transfer characteristics of the predistortion unit start to be changed, can be adjusted by one control signal through one special port.

Figure 3:
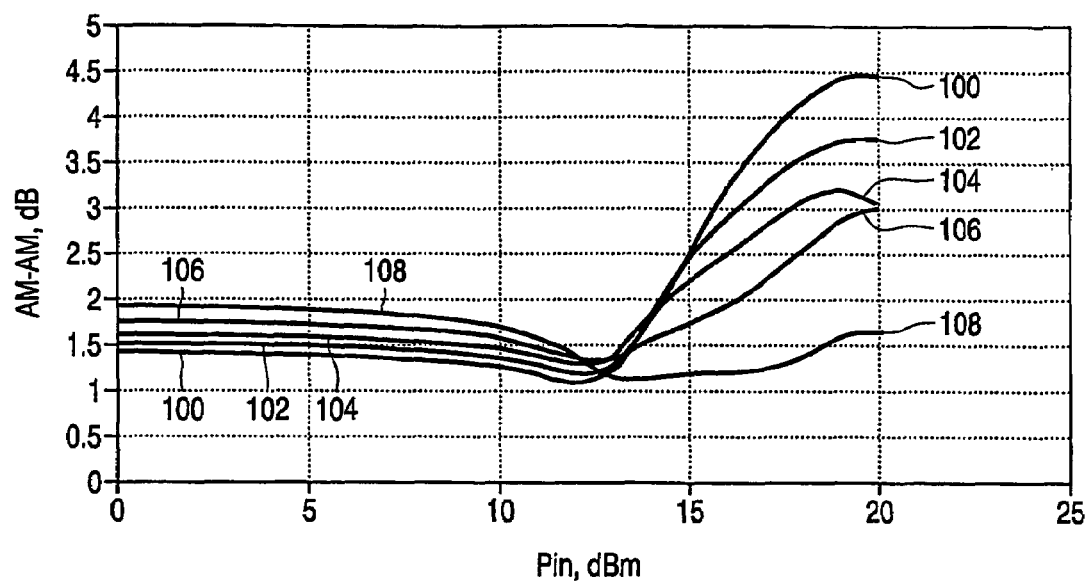
Figure 4:
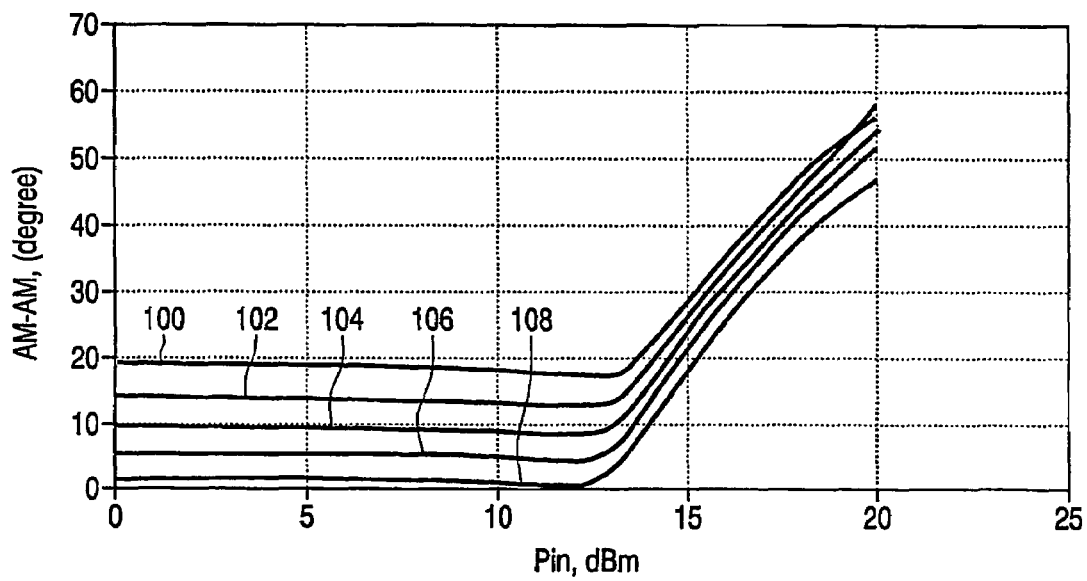

In the embodiment shown in FIG. 2 the AM/AM rate is controlled by the adjustable resistor 66 and the AM/PM rate is controlled by the adjustable delay line 70. FIGS. 3 and 4 show measured lines at independent AM/AM regulation at constant AM/PM rate in the predistortion unit embodiment of FIG. 1. The curve show different values of the resistor 66. The curve 100 represents the value of 0 Ohm of the resistor 66. The curve 102 represents the value of 1 Ohm of the resistor 66. The curve 104 represents the value of 2 Ohm of the resistor 66. The curve 106 represents the value of 3 Ohms of the resistor 66. The curve 108 represents the value of 4 Ohms of the resistor 66.

Figure 5:
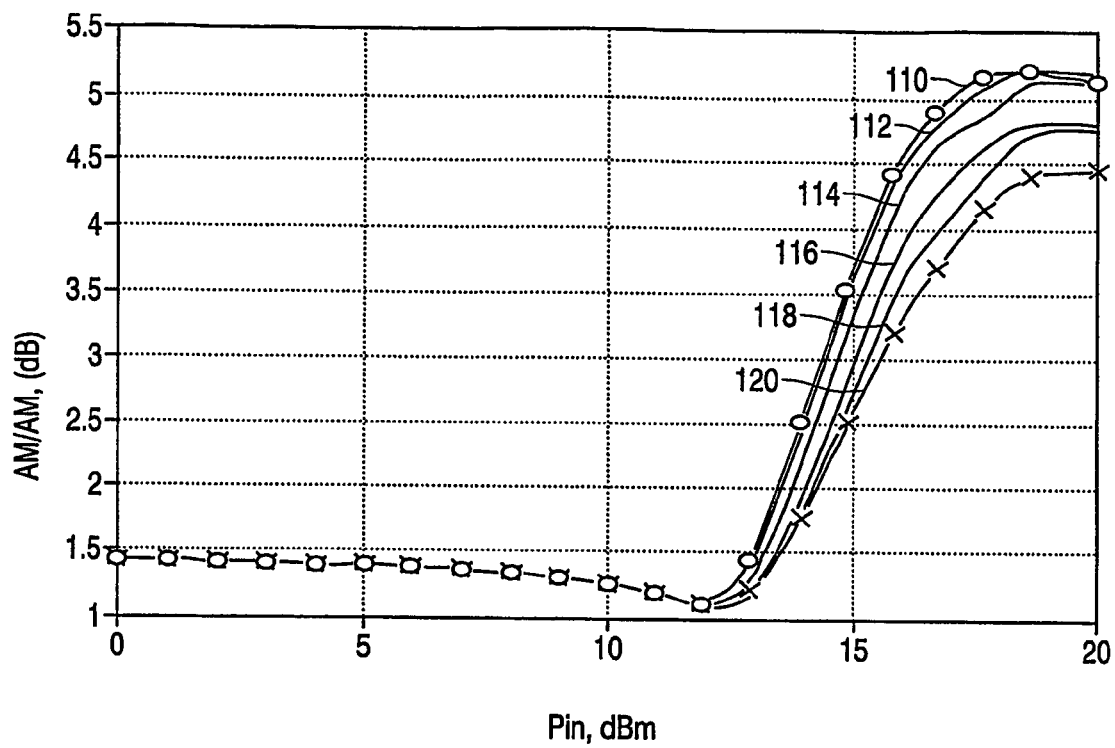
Figure 6:
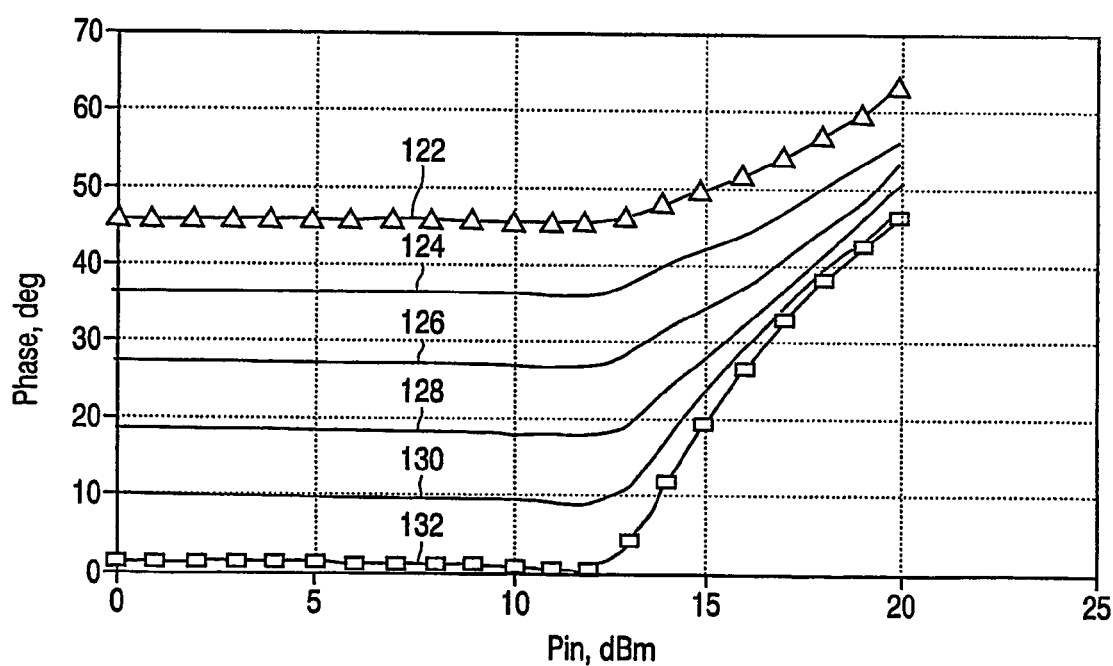

FIGS. 5 and 6 show independent AM/PM regulation at constant AM/AM rate in the predistortion unit embodiment of FIG. 2. In FIG. 5 the curve 110 represents 30°. The curve 112 represents 40°. The curve 114 represents 50°. The curve 116 represents 60°. The curve 118 represents 80°. The curve 120 represents 90°. In FIG. 6, the curve 122 represents 30°. The curve 124 represents 40°. The curve 126 represents 50°. The curve 128 represents 60°. The curve 130 represents 70°. The curve 132 represents 80°.

Figure 7:
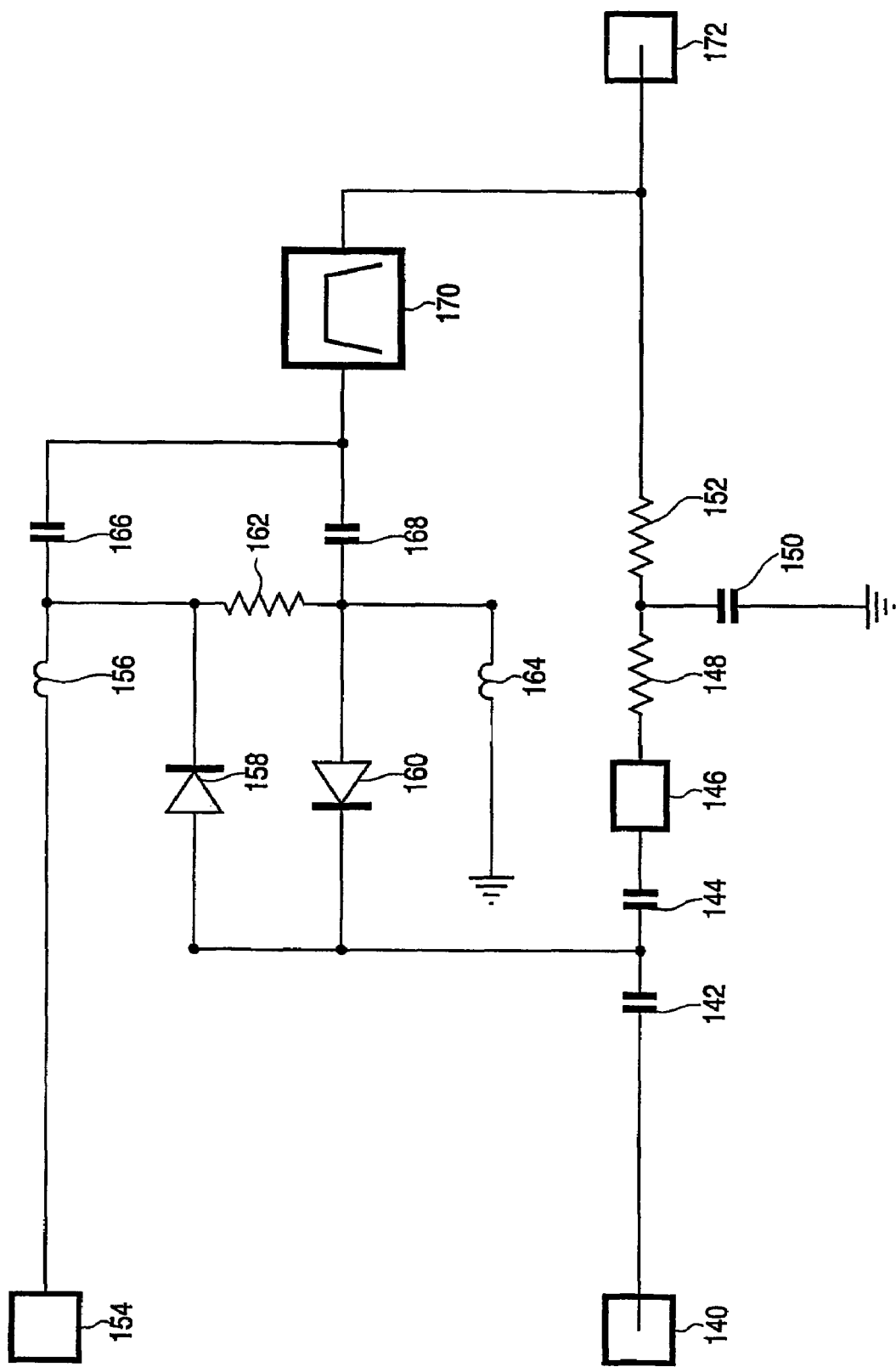
FIGS. 7 to 16 show another embodiment of the present invention with the related circuit diagrams and the related measured graphs.

FIG. 7 shows another embodiment of the present invention. The embodiment shown comprises an input terminal 140 connected to a capacitance 142. The capacitance 142 is connected on the other side to the anode of a diode 158, the cathode of a diode 160 and a capacitance 144. The capacitance 144 is connected on the other side to a delay line 146. The delay line 146 is connected on the other side to a resistor 148. The resistor 148 is connected on the other side to a capacitance 150 and a resistor 152. The capacitance 150 is connected on the other side to ground. The resistor 152 is connected on the other side to an output terminal 172. The cathode of the diode 158 is connected to an inductance 156, a capacitance 166 and a resistor 162. The other side of the resistor 162 is connected to the anode of the diode 160, an inductance 164 and a capacitance 168. The inductance 164 is connected to ground. The other side of the capacitance 168 is connected to another side of the capacitance 166 and an amplifier 170. The amplifier 170 is connected to the output terminal 172. The terminal 154 of the threshold power control is connected to the other side of the inductance 156.

The amplifier 170 is a gain control amplifier. The capacitance 150 is a variable capacitance or an element with a controlled capacitance value. The embodiment is a predistortion unit with extended dynamic range and controllable AM/AM and AM/PM regulation rates. It has been shown that the amplifier 170, when gain varies from 0 dB to 6 dB, simultaneously provides phase valuation rate control from 5°/dB to 20°/dB and an amplitude regulation rate control from 0.3 dB/dB to 1 dB/dB. Furthermore, the variation of the capacitance 150 from 0 to 3 pF can provide AM/AM regulation rate control, while the AM/PM rate characteristic is constant. The IRL of the predistortion unit is less than −10 dB in the power range. The initial losses also can be improved to about −3 dB instead of −(8. . . 6) dB.

The predistortion unit of the embodiments of the present invention provides an extended dynamic range, a control over a threshold input power level at which the amplitude and phase regulation begins, an independent control over amplitude and phase regulation rates in the range of a predistortion, and a higher amplitude and phase regulation rate.

This predistortion unit can also be used at the same time for temperature compensation of linearized power module, where a VARICAP, presented as a capacitance 150, is a controlled element of an AM/AM compensation loop and an amplifier control element for an AM/PM compensation.

Figure 8:
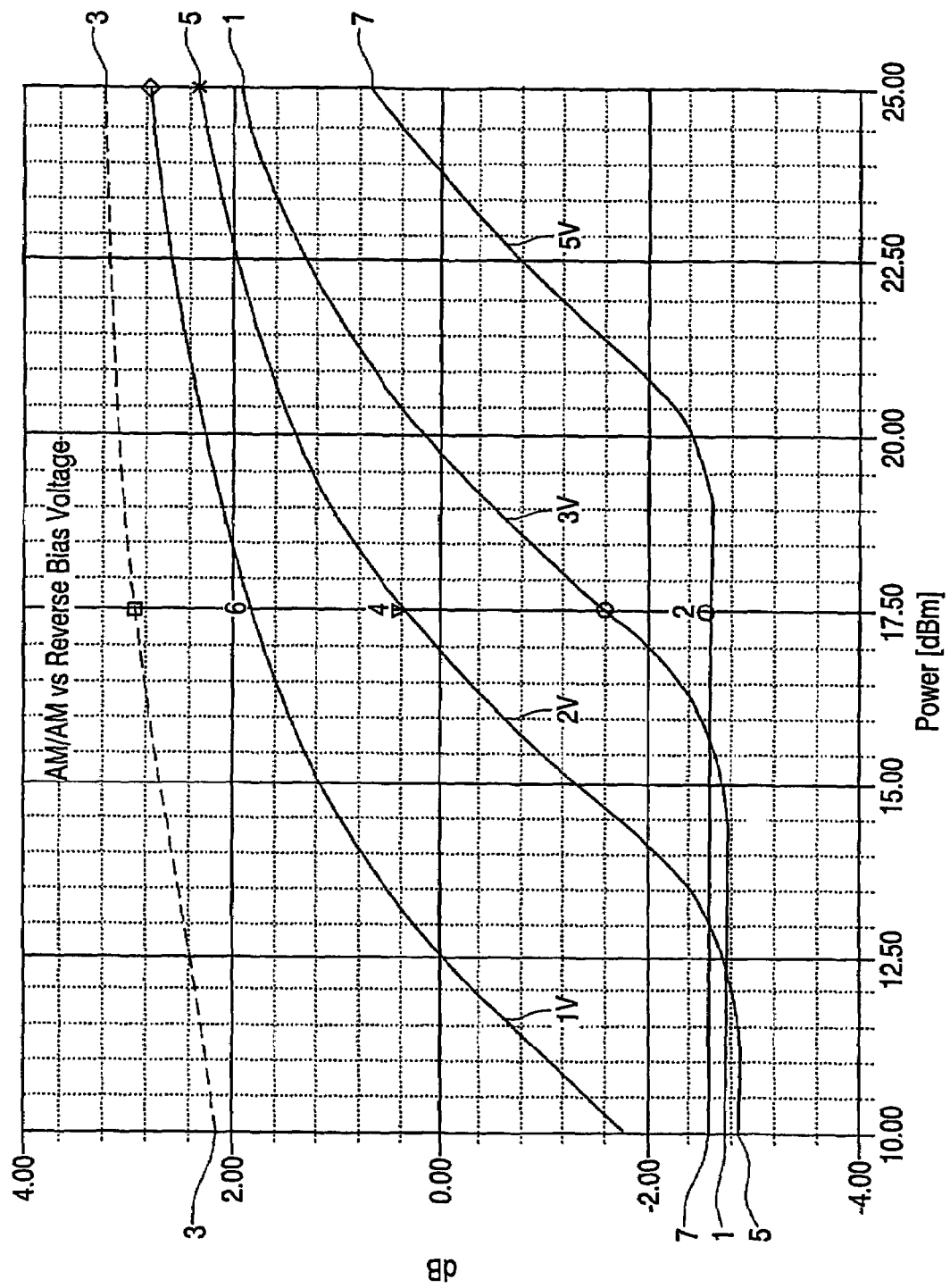
Figure 9:
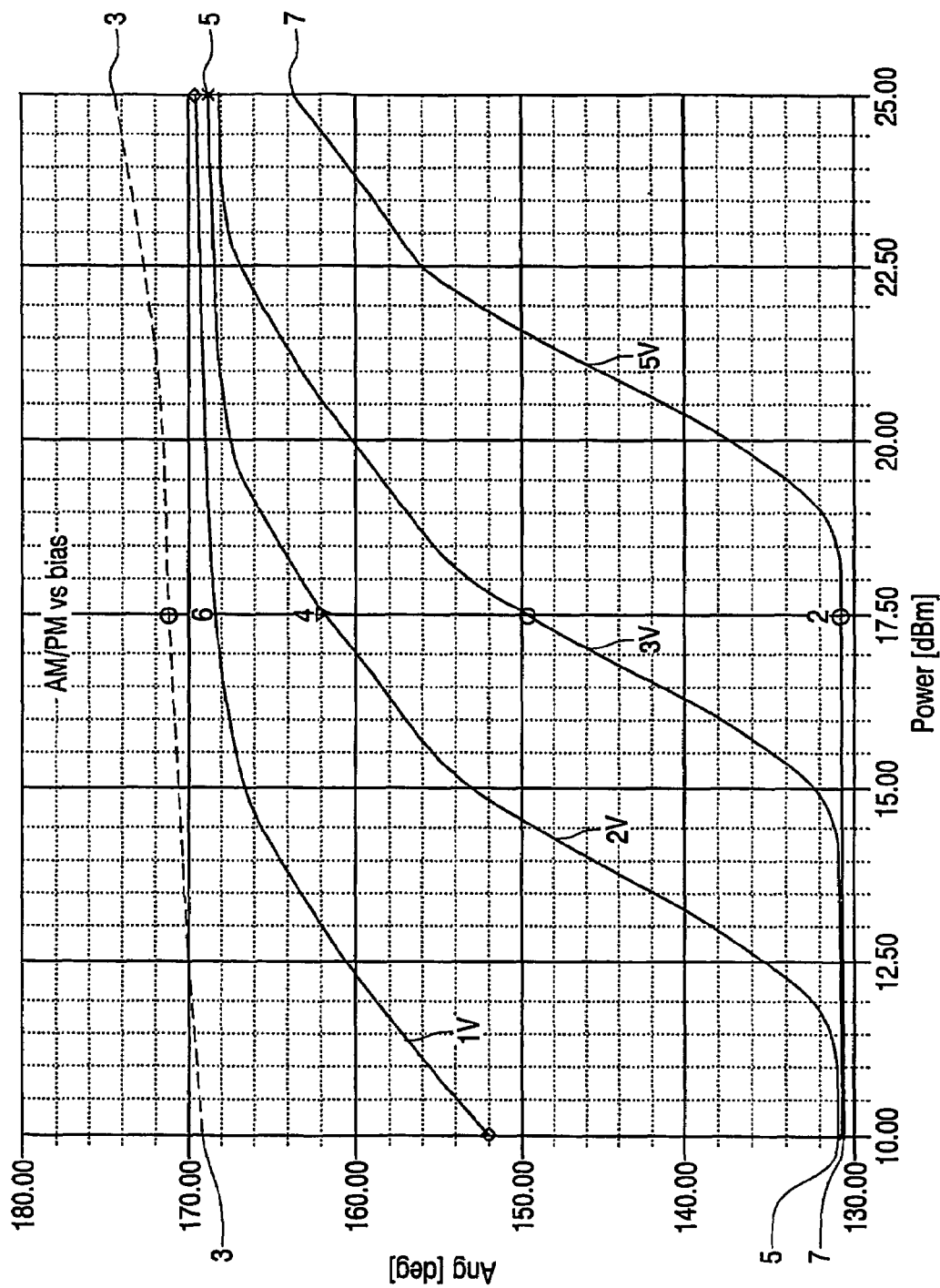
Figure 10:
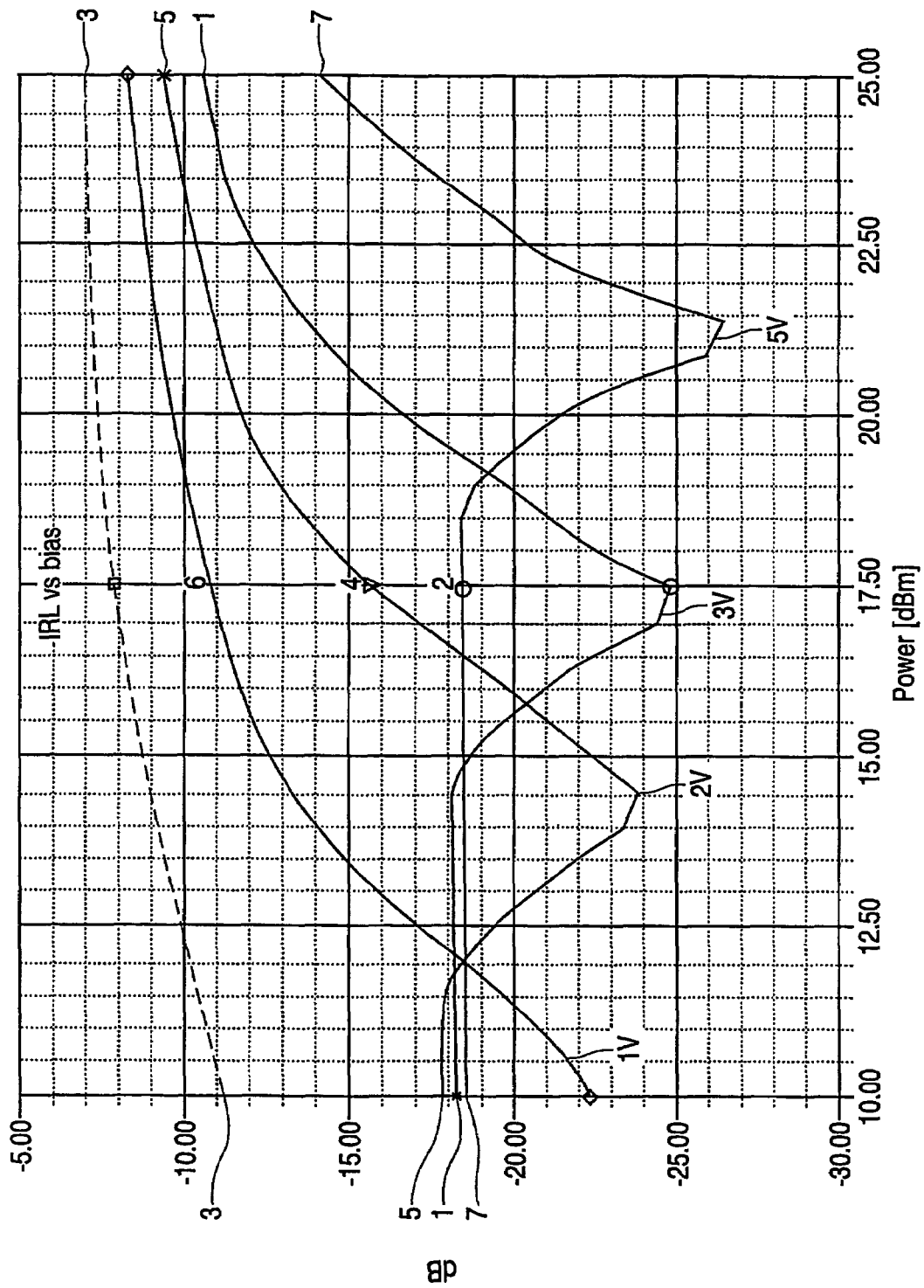
Figure 11:
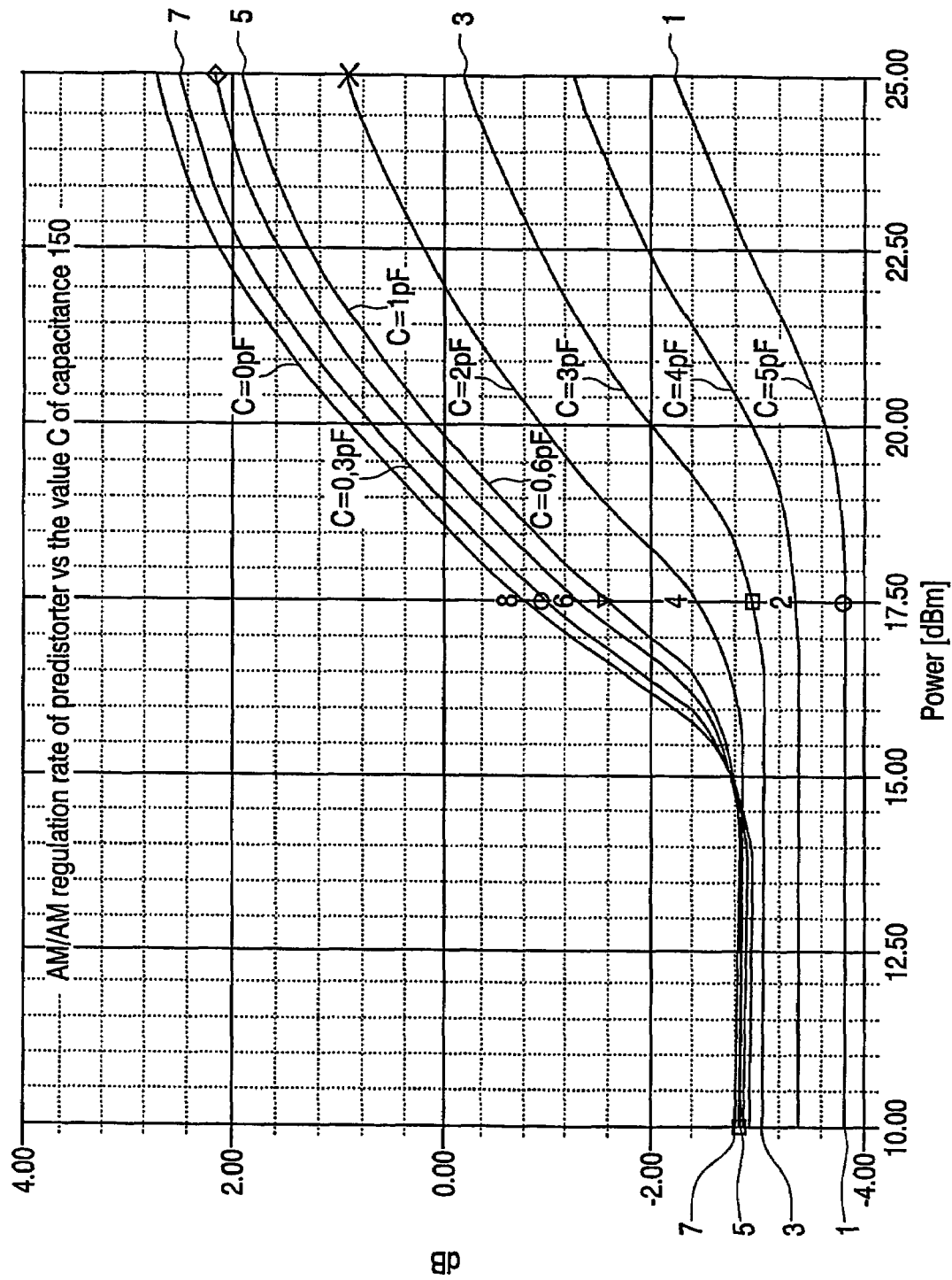
Figure 12:
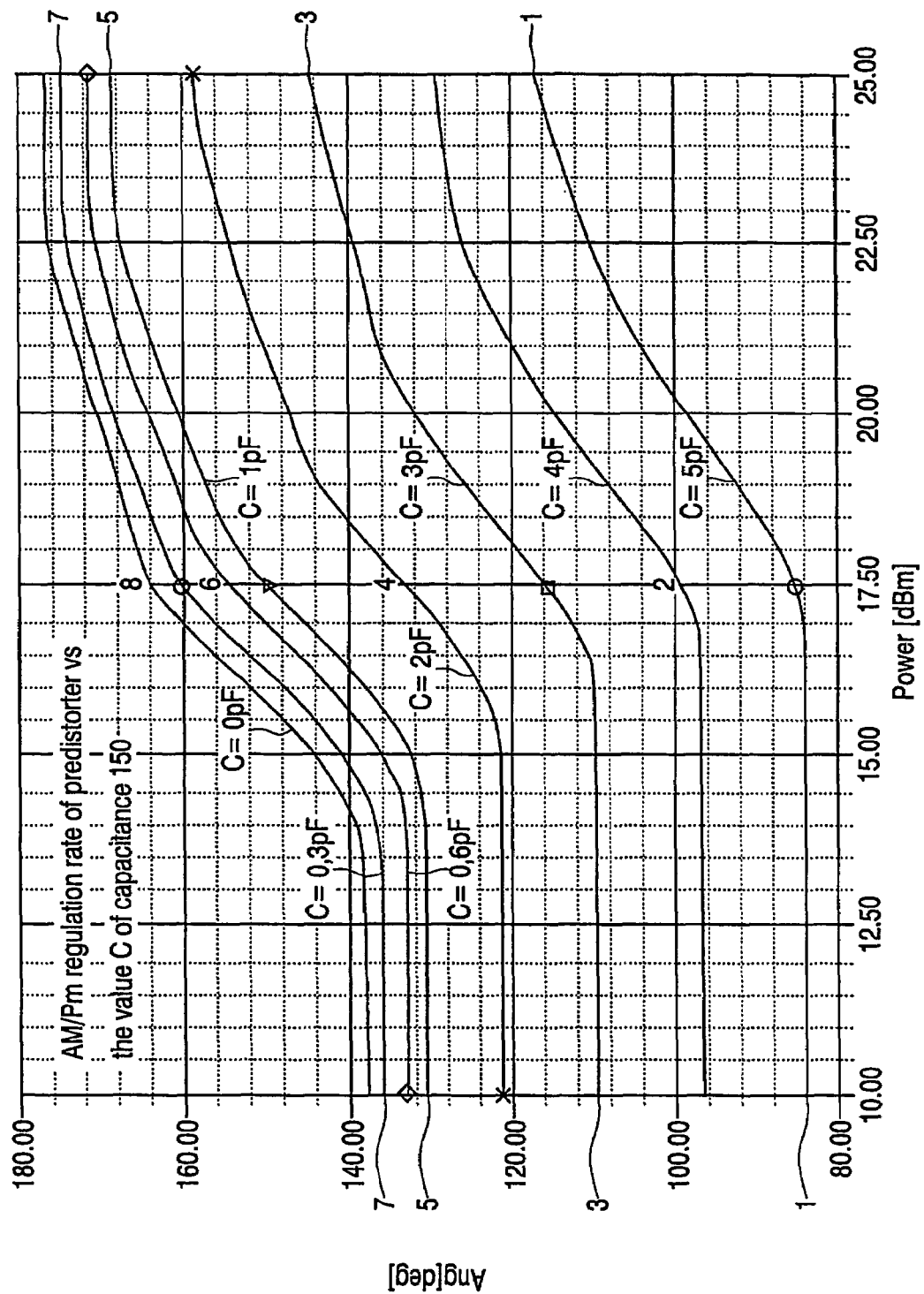
Figure 13:
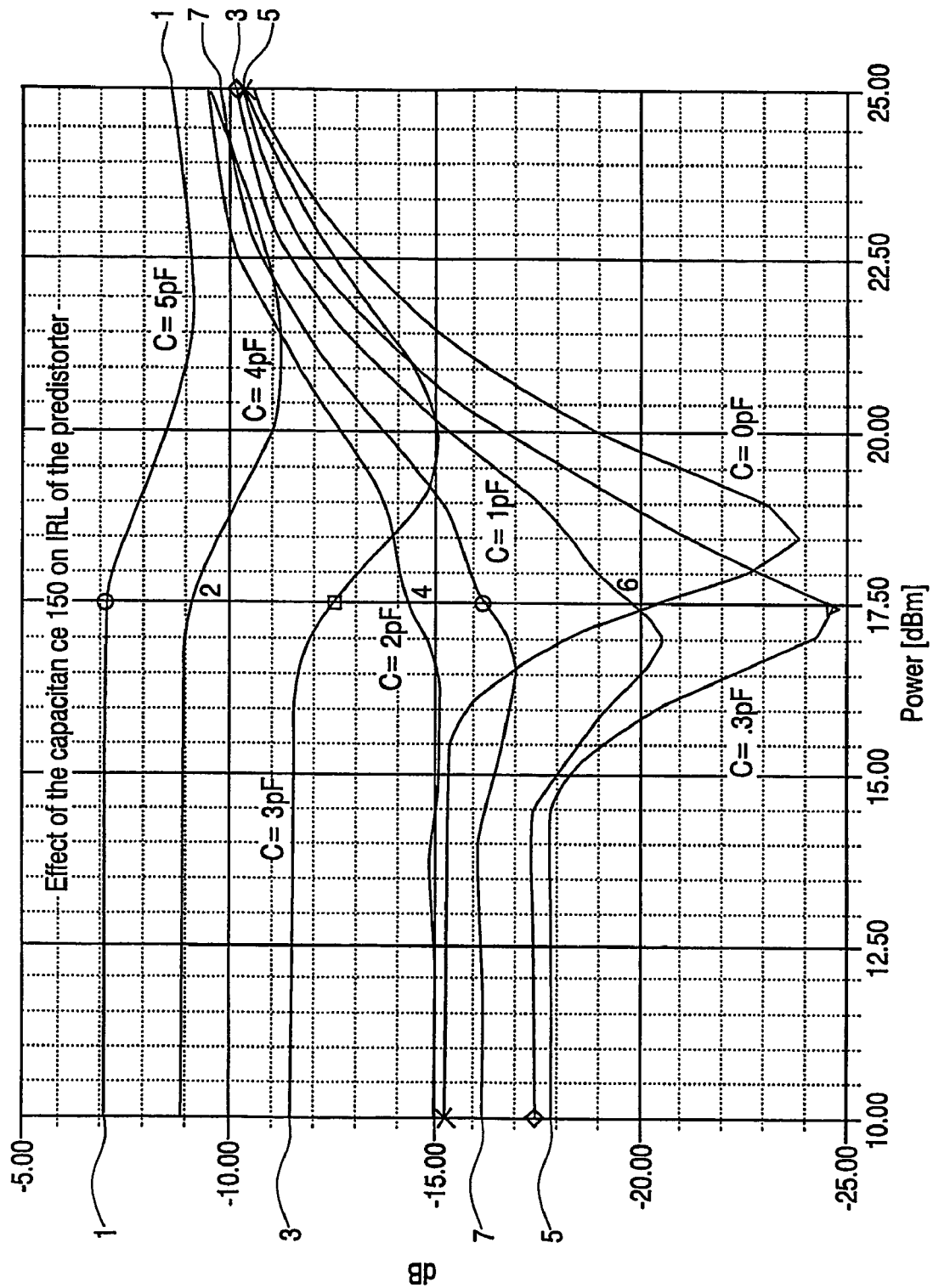
Figure 14:
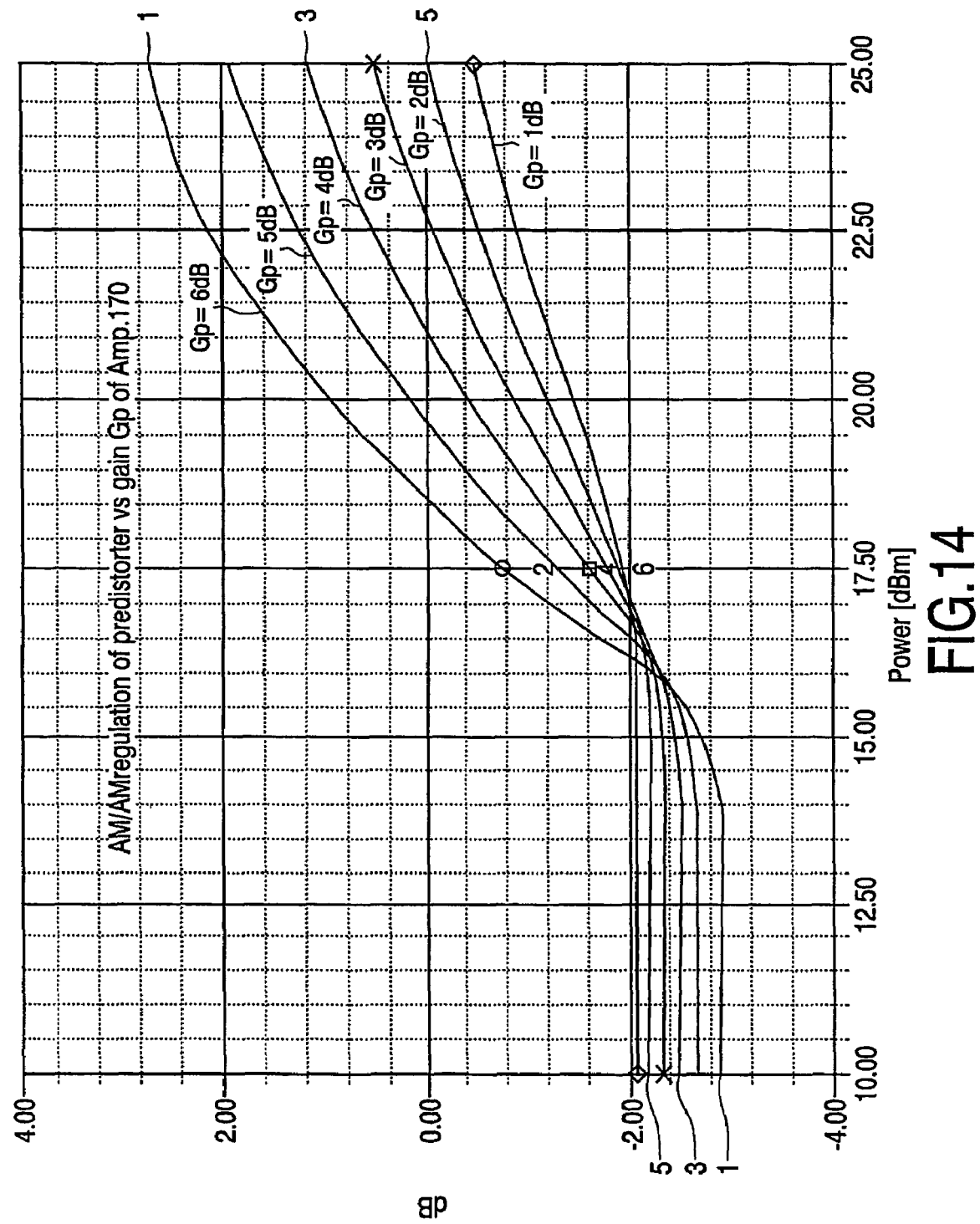
Figure 15:
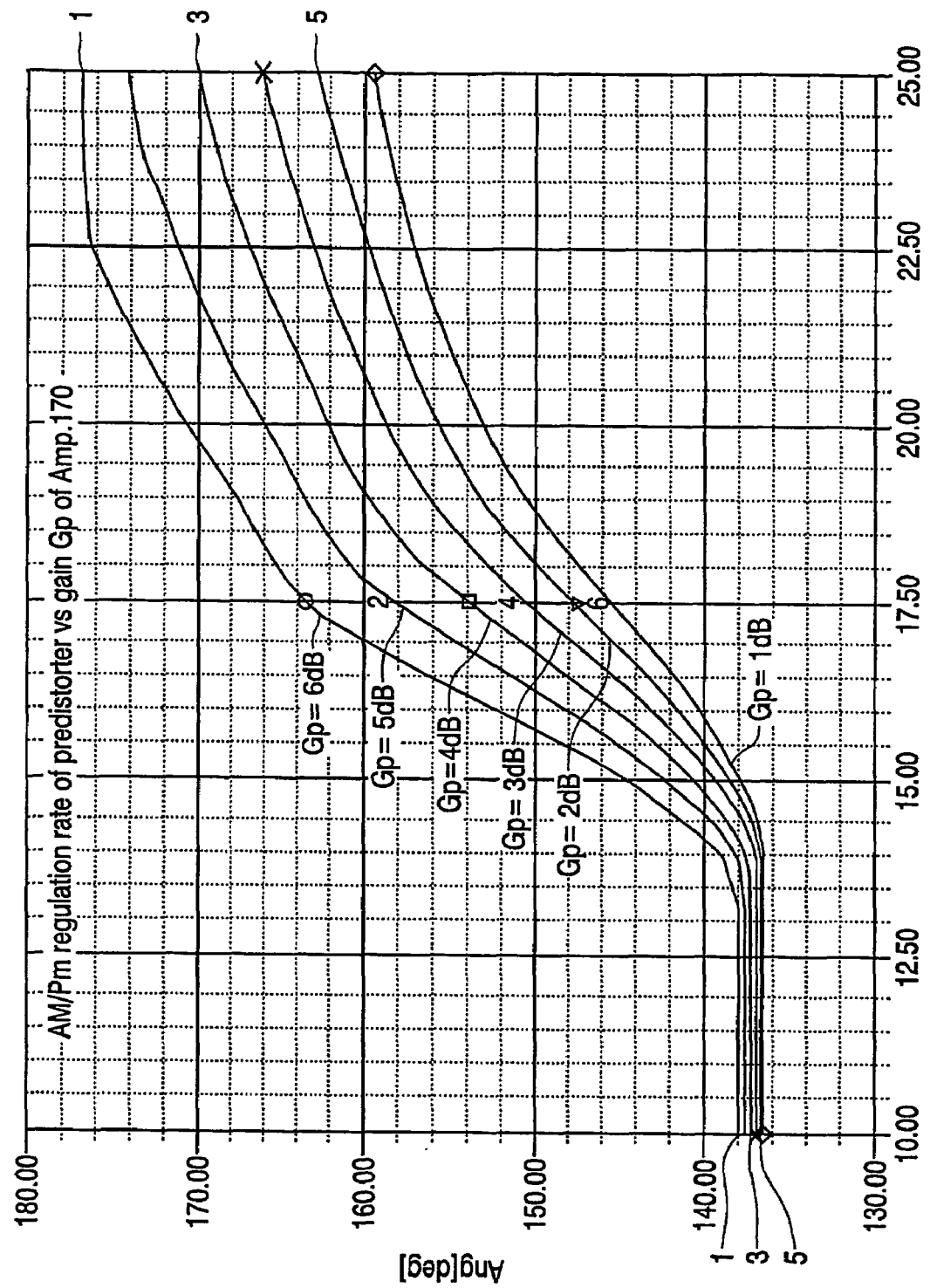
Figure 16:
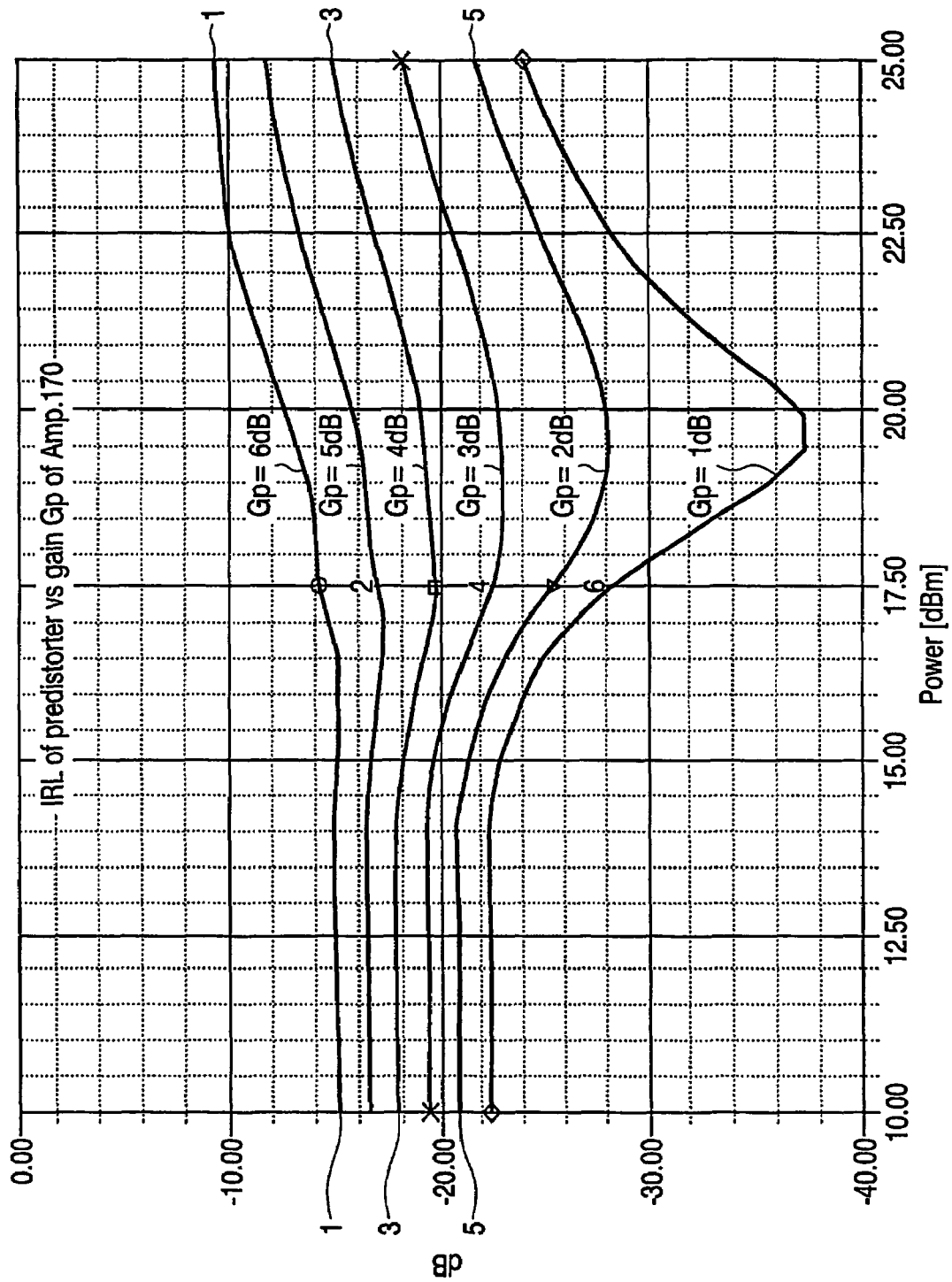

The FIGS. 8 to 16 show different measurements of the embodiment of FIG. 7. FIGS. 8, 9 and 10 represent AM/AM and AM/PM and IRL versus different bias voltage values. FIGS. 11 and 12 show AM/AM and AM/PM regulation rate of the predistortion unit versus different values of the capacitance 150. FIG. 13 shows the effect of the different values of the capacitance 150 on IRL of the predistortion unit of FIG. 7. FIGS. 14 and 15 show the AM/AM and the AM/PM regulation rate of the predistortion unit versus the gain of the amplifier. FIG. 16 shows the effect of the amplifier gain on IRL of the predistortion unit.

Further embodiments of the present invention are presented in FIGS. 17 to 27. In order to show the principle and for reasons of simplicity, only the first and second branches are shown.

Figure 17:
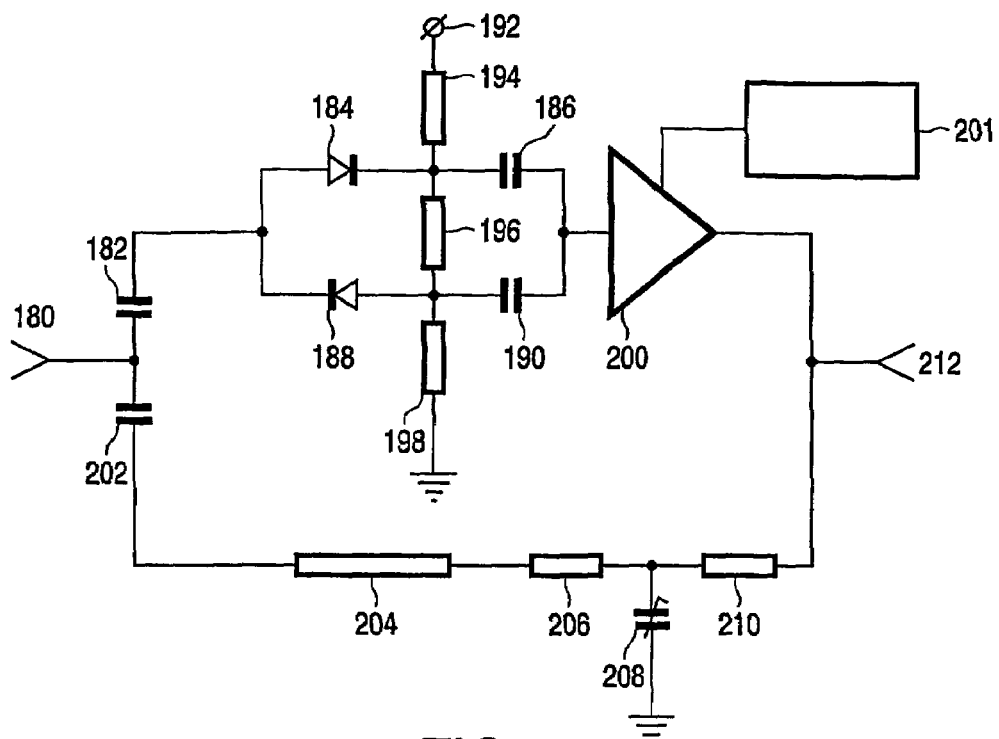
FIGS. 17 to 28 show different embodiments of the present invention.

FIG. 17 shows an embodiment of the present invention. The embodiment comprises an input terminal 180 connected to a capacitance 182 and to a capacitance 202. The other side of the capacitance 182 is connected to an anode of the diode 184 and to a cathode of the diode 188. The cathode of the diode 184 is connected to a capacitance 186, a resistor 194 and a resistor 196. The resistor 194 is connected on the other side to a terminal 192. The capacitance 186 is connected on the other side to an input terminal of an amplifier 200 and a capacitance 190. The other side of the resistor 196 is connected to the other side of the capacitance 190, a resistor 198 and the anode of the diode 188. The other side of the resistor 198 is connected to ground. The amplifier 200 is connected to a gain control unit 201. The upper terminal of the amplifier 200 is connected to the output terminal 212. The other side of the capacitance 202 is connected to a delay line 204. The other side of the delay line 204 is connected to a resistor 206. The other side of the resistor 206 is connected to an adjustable capacitance 208 and to a resistor 210. The other side of the capacitance 208 is connected to ground. The other side of the resistor 210 is connected to the output terminal 212.

The embodiment described includes an amplification block (so-called gain control amplifier-AGC) which helps for low losses of the predistortion unit and higher achievable rates of the phase and amplitude predistortions.

The elements 184 to 198 provide a threshold control of the input signal. The terminal 192 provides the bias voltage of the threshold control unit. Furthermore, the threshold control unit of the elements 184 to 198 and the amplifier 200 form the nonlinear branch. The linear branch is formed by the delay line 204 and the resistors 206 and 210 and the adjustable capacitance 208. The adjustable capacitance 208 serves to control the AM/PM rate.

Figure 18:
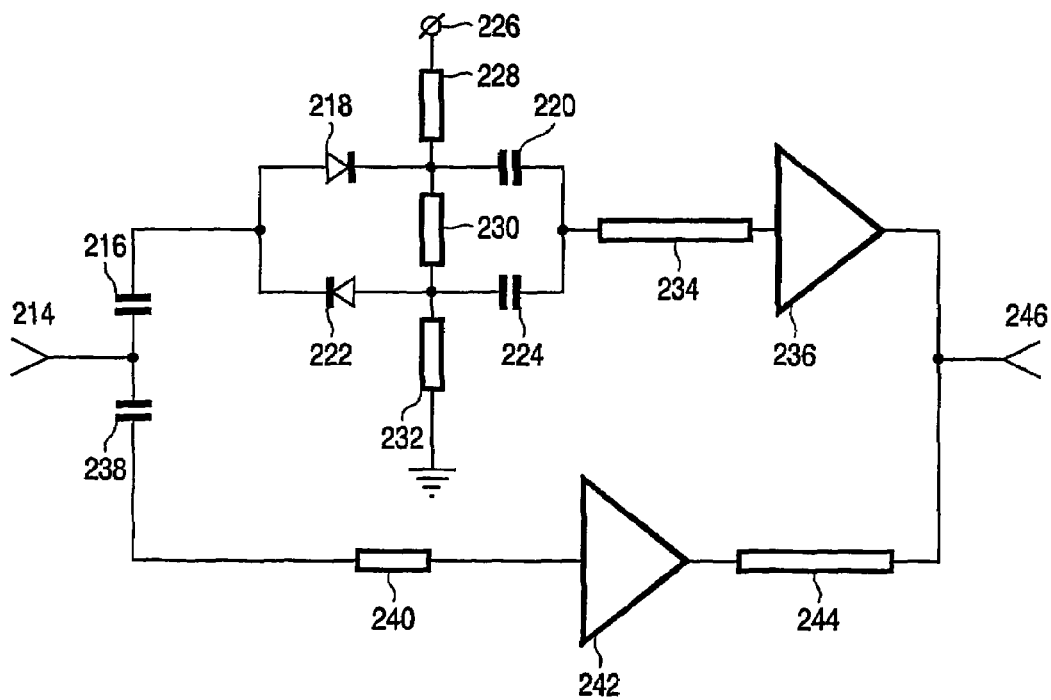

FIG. 18 shows another embodiment of the present invention. The embodiment comprises an input terminal 214 connected to a capacitance 216 and to a capacitance 238. The capacitance 216 is connected on the other side to a threshold control unit, which is equivalent to the threshold control unit of FIG. 17 described earlier. Therefore, the elements 218 to 232 are equivalent to the elements 184 to 198 of FIG. 17. The capacitances 220 and 224 are connected to a delay line 234. The delay line is connected on the other side to an amplifier 236 which is a gain control amplifier. The output of the amplifier 236 is connected to the output terminal 246. The other side of the capacitance 238 is connected to a resistor 240. The other side of the resistor 240 is connected to an input terminal of an amplifier 242. The amplifier 242 is also a gain control amplifier.

The output terminal of the amplifier 242 is connected to a delay line 244. The output of the delay line 244 is connected to the output terminal 246. In this embodiment both branches have a gain control amplifier. These gain control amplifiers 236 and 242 can provide separate amplitude and phase predistortion rate adjustment without gain losses. The upper branch of FIG. 18 is the nonlinear branch providing the AM/AM rate regulation, and the lower branch of FIG. 18 provides the AM/PM rate regulation.

Figure 19:
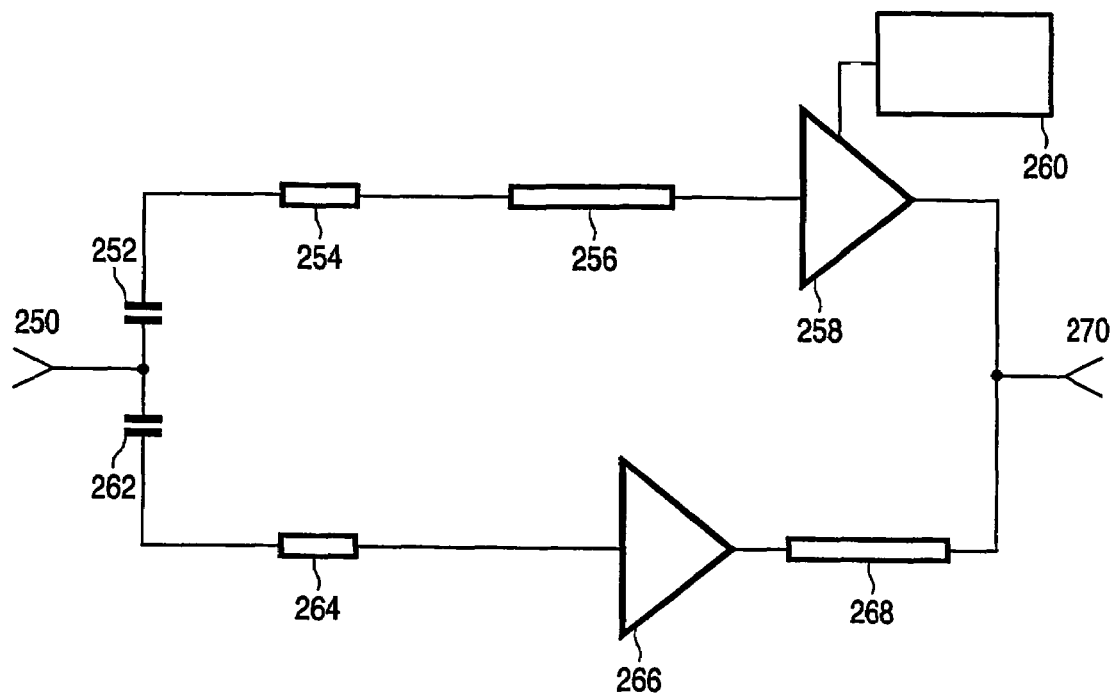

FIG. 19 shows another embodiment of the present invention. This embodiment comprises an input terminal 250 connected to a capacitance 252 and to a capacitance 262. The other side of the capacitance 252 is connected to a resistor 254. The other side of the resistor 254 is connected to a delay line 256. The other side of the delay line 256 is connected to an amplifier 258. The amplifier 258 is a B-class amplifier. The amplifier 258 is connected to a bias control unit 260. The output terminal of the amplifier 258 is connected to an output terminal 270. The other side of the capacitance 262 is connected to a resistor 264. The other side of the resistor 264 is connected to an amplifier 266. The amplifier 266 is a gain control amplifier. The output terminal of the amplifier 266 is connected to a delay line 268. The other side of the delay line is connected to the output terminal 270.

The embodiment shown has the following features. The delay lines 256 and 268 specify the predistortion rate for the required phase. The gain of the amplifier 266 defines the predistortion unit gain. The amplifier 258 connected to the bias control unit 260 defines a threshold power level adjustment. An amplitude predistortion rate is defined by the ratio between re-gain of the amplifier 266 and the gain of the amplifier 258. The resistors 254 and 264 are used for power division and matching conditions.

Figure 20:
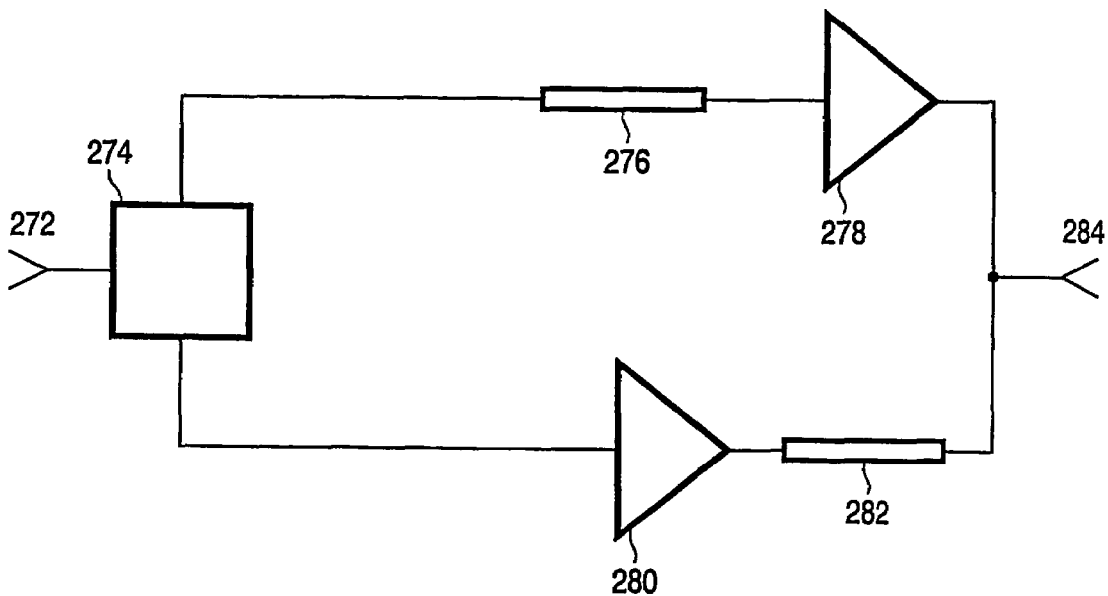

The embodiment of FIG. 20 comprises an input terminal 272 connected to a power divider 274. The power divider 274 is connected on one side to a delay line 276 and to an input terminal of an amplifier 280 on the other side. The amplifier 280 is a gain control amplifier. The other side of the delay line 276 is connected to an input terminal of an amplifier 278. The amplifier 278 is a B-class amplifier. The amplifier 278 is connected to a bias control unit which is not shown. The output of the amplifier 278 is connected to an output terminal 284. The output terminal of the amplifier 280 is connected to one side of a delay line 282. The other side of the delay line 282 is connected to the output terminal 284.

The difference between the embodiment shown in FIG. 20 and the former embodiments is that that the embodiment of FIG. 20 comprises a power divider 274 at the input. This power divider 274 can provide better and constant input return losses.

Figure 21:
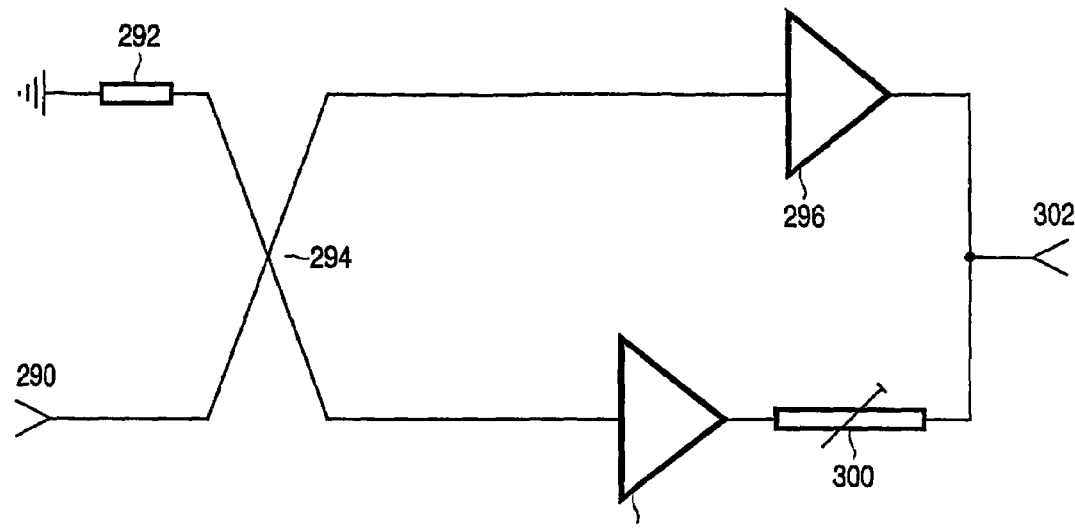

The embodiment of FIG. 21 comprises an input terminal 290 connected to a hybrid coupler 294. A 50-OHM resistor 292 is connected on the one side to the hybrid coupler 294. The other side of the resistor 292 is connected to ground. The hybrid coupler 294 crosses the lines from the resistor 292 to an A-class amplifier 298 with the line of the input terminal 290 to an amplifier 296. Therefore, the input terminal 290 is connected directly via the hybrid coupler 294 to the amplifier 296. Also the resistor 292 is connected directly via the hybrid coupler 294 to an input terminal of the amplifier 298. The amplifier 298 is a gain control amplifier. The output terminal of the amplifier 298 is connected to one side of a delay line 300. The delay line 300 is adjustable. The other side of the delay line 300 is connected to an output terminal 302. The amplifier 296 is a B-class amplifier connected to a bias control unit. The output terminal of the amplifier 296 is connected to the output terminal 302.

Just like the embodiment shown in FIG. 20, the embodiment of FIG. 21 also differs from the preceding embodiments in that the embodiment of FIG. 21 comprises a power divider at the predistortion unit input. This power divider in FIG. 21 is represented by the hybrid coupler 294. This hybrid coupler 294 provides better and constant input return losses.

Figure 22:
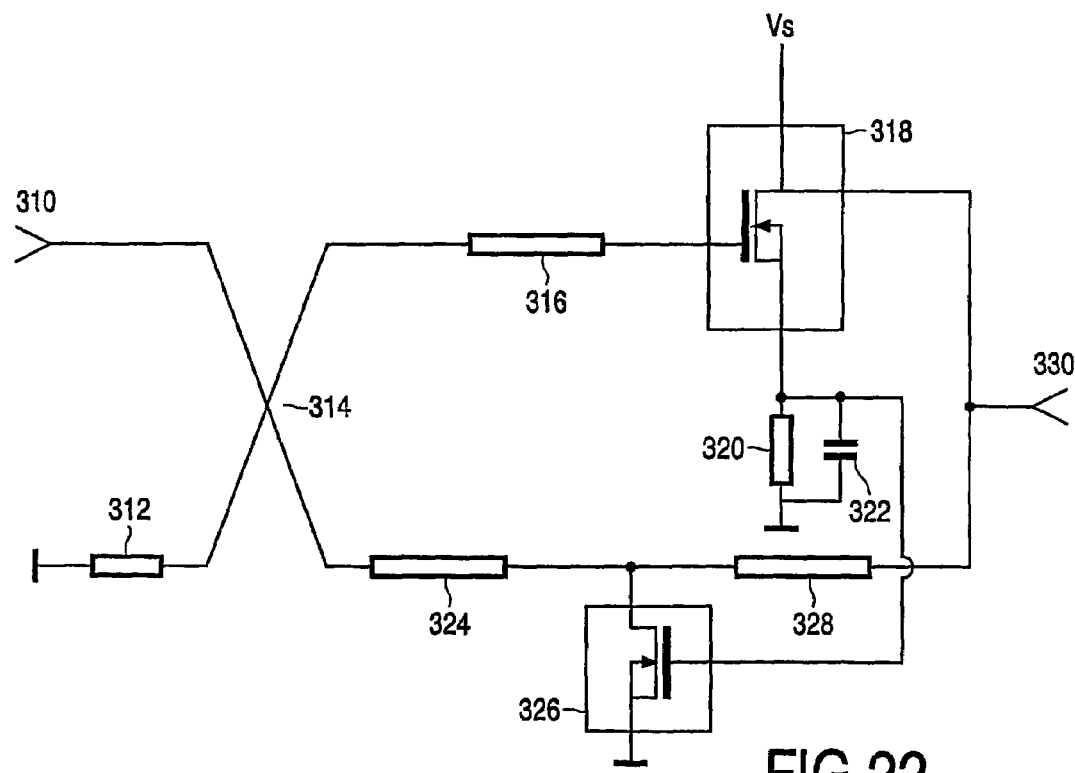

FIG. 22 shows an embodiment of the present invention comprising an input terminal connected to a power divider 314. A resistor 312 is connected on one side to ground and on the other side the resistor is connected to the power divider 314. The power divider 314 crosses the lines from the input terminal 310 to a 90° delay line 324 with the line from the resistor 312 to a delay line 316. The delay line 316 is connected on the other side to a gate terminal of a transistor 318. The transistor 318 is a B-class amplifier. The drain terminal of transistor 318 is connected to a power supply which is not shown. The drain terminal of transistor 318 is also connected to an output terminal 330. The source terminal of transistor 318 is connected to a resistor 320 and a capacitance 322. The resistor 320 and the capacitance 322 are connected on the other side to ground. The other side of the delay line 324 is connected to a 90° delay line 328 and a drain terminal of a transistor 326. The transistor 326 represents a controllable electrical resistance element. The source terminal of transistor 326 is connected to ground. The gate terminal of transistor 326 is connected to the source terminal of transistor 318. The other side of the delay line 328 is connected to the output terminal 330.

The circuit of FIG. 22 uses a property of 90° transmission or delay lines 324 and 328 as an impedance inverter where, after the passing of the threshold power level in the B-class amplifier 318, the drain or collector current appears and starts to grow and the voltage to drop, and the resistor 320 acting as a drain or collector current sensor is opening the transistor 326 as a controllable resistance element which finally provides a short circuit in the point of 90° line connection which is the connection point between the 90° delay line 324 and the 90° delay line 328 and an open circuit on the opposite sides of the delay lines 324, 328. Thus, the RF-signal is switched from one branch to another, providing constant input/output impedance of the predistortion unit circuit.

Figure 23:
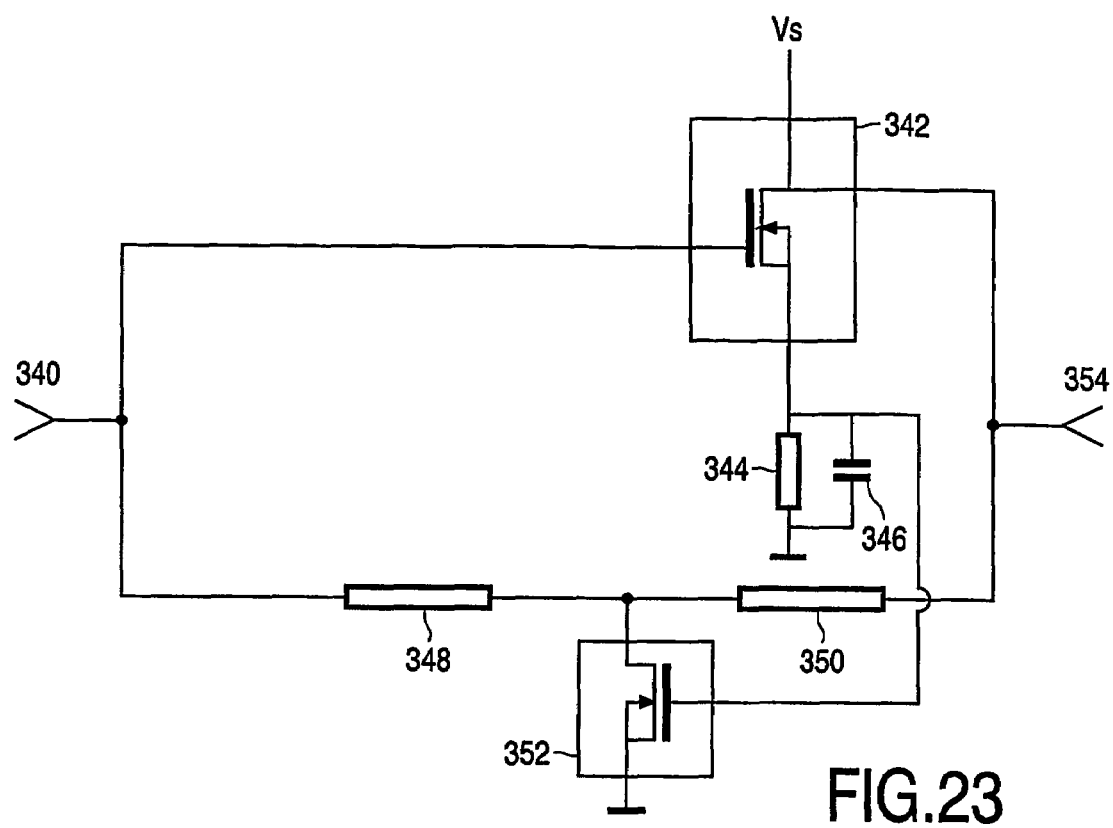

Another simplified configuration of the circuit of FIG. 22 is shown in FIG. 23. The circuit of FIG. 23 comprises an input terminal 340 connected to a gate terminal of a transistor 342 and connected to a delay line 348. The transistor 342 is a B-class amplifier. The drain terminal of transistor 342 is connected to a power supply which is not shown and to an output terminal 354. The source terminal of transistor 342 is connected to a resistor 344 acting as a drain or collector current sensor and a capacitance 346. The resistor 344 and the capacitance 346 are connected to ground. The other side of the delay line 348 is connected to a delay line 350 and to a drain terminal of a transistor 352. The transistor 352 is a controllable electrical resistance element. The source terminal of the transistor 352 is connected to ground. The gate terminal of transistor 352 is connected to the source terminal of transistor 342.

Figure 24:
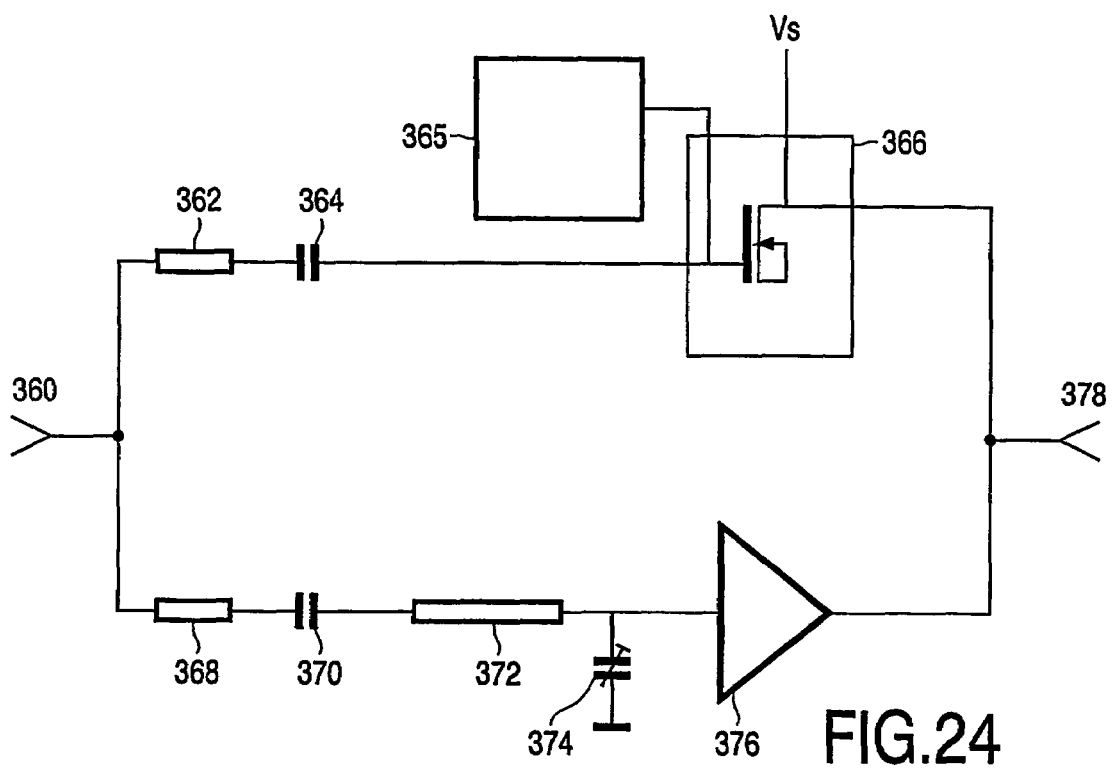

FIG. 24 shows an embodiment of the present invention comprising an input terminal connected to a resistor 362 and to a resistor 368. The other side of the resistor 362 is connected to a capacitance 364. The other side of the capacitance 364 is connected to a gate terminal of a transistor 366. The transistor 366 is a B-class amplifier. A bias control unit of threshold power 365 is connected to the gate terminal of the transistor 366. A power supply not shown is connected to a drain terminal of transistor 366. A source terminal of transistor 366 is connected to ground. The drain terminal of transistor 366 is connected to an output terminal 378. The other side of the resistor 368 is connected to a capacitance 370. The other side of the capacitance 370 is connected to a delay line 372. The other side of the delay line 372 is connected to an adjustable capacitance 374 and to an input terminal of the amplifier 376. The capacitance 374 is used to control the AM/PM rate. The amplifier 376 is a gain control amplifier, allowing to adjust the losses of the branch and isolation between the branches. The amplifier 366 is used to control the AM/AM rate. The output terminal of the amplifier 376 is connected to the output terminal 378.

Figure 25:
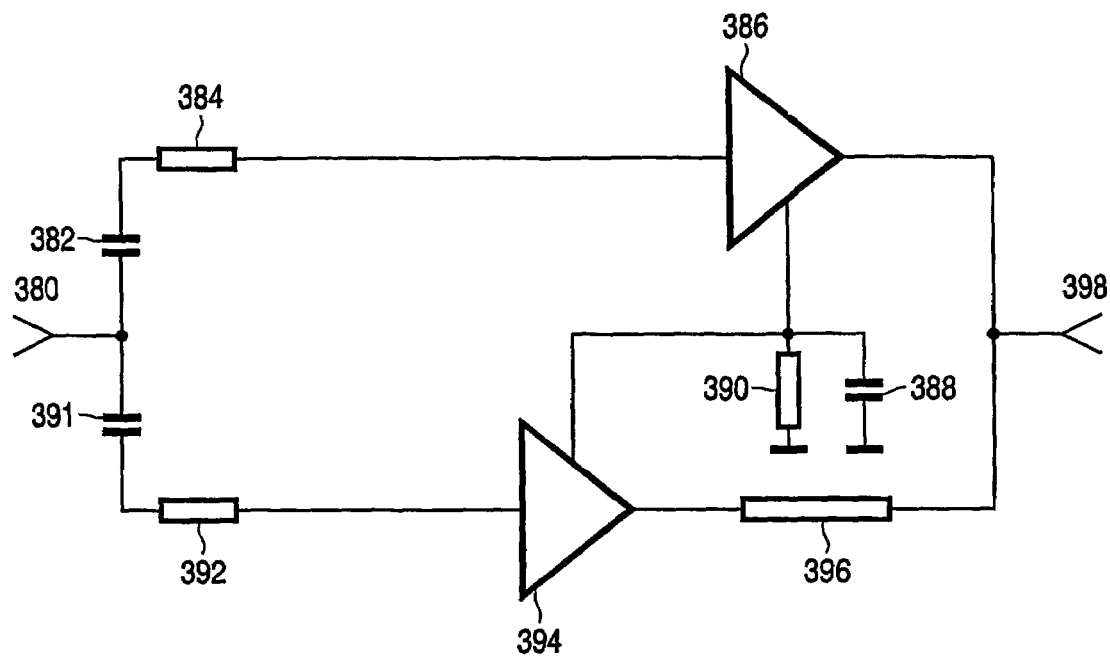

FIG. 25 shows another embodiment of the present invention. The circuit of FIG. 25 comprises an input terminal 380 connected to a capacitance 382 and a capacitance 391. The capacitance 382 is connected on the other side to a resistor 384. The resistor 384 is connected on the other side to an input terminal of an amplifier 386. The amplifier 386 is a B-class amplifier. The output terminal of amplifier 386 is connected to an output terminal 398. The amplifier 386 is connected via a control terminal to a resistor 390 and a capacitance 388. The resistor 390 and the capacitance 388 are connected on the other side to ground. The other side of the capacitance 391 is connected to a resistor 392. The other side of the resistor 392 is connected to an input terminal of an amplifier 394. The amplifier 394 is a gain control amplifier. The output terminal of the amplifier 394 is connected to a delay line 396. The delay line 396 is connected to the output terminal 398. A gain control terminal of the amplifier 394 is connected to the resistor 390 and to the capacitance 388.

Figure 26:
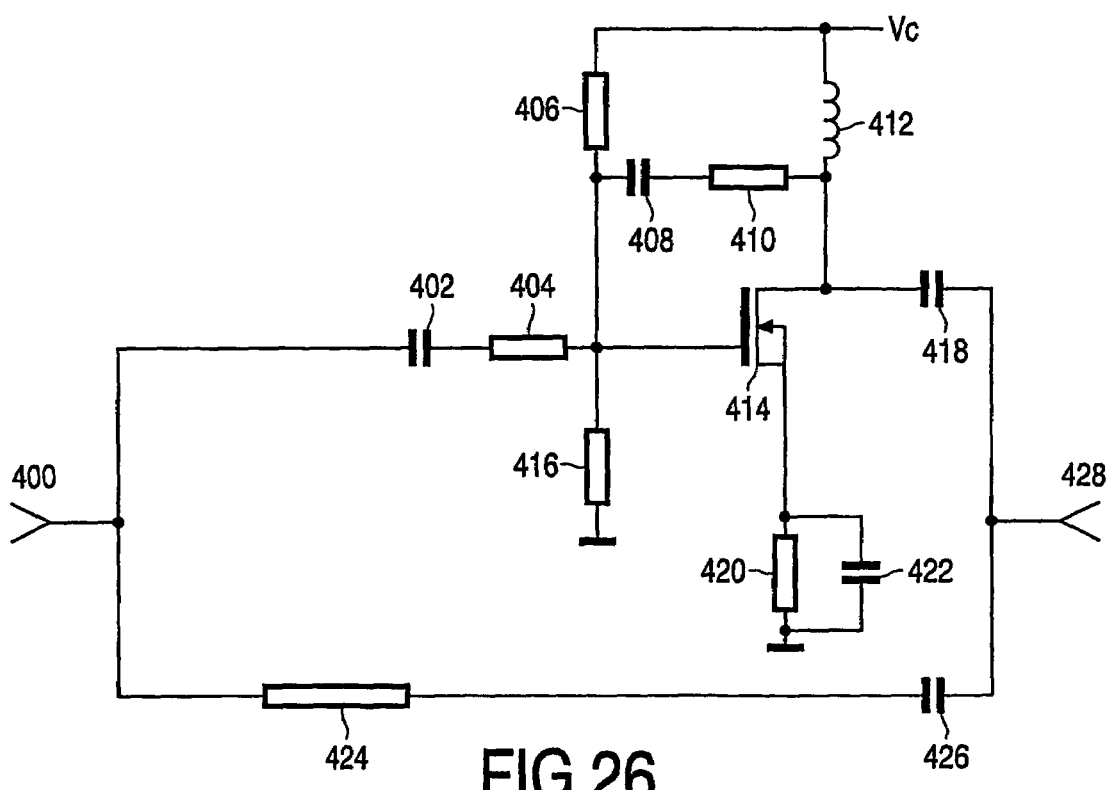

FIG. 26 shows another embodiment of the present invention. The embodiment comprises an input terminal 400 connected to a capacitance 402 and a delay line 424. The capacitance 402 is connected to a resistor 404. The other side of the resistor 404 is connected to a resistor 406, a capacitance 408, a gate terminal of a transistor 414 and a resistor 416. The resistor 416 is connected on the other side to ground. The resistor 406 is connected on the other side to a control voltage Vc. The voltage Vc controls the threshold voltage. The capacitance 408 is connected to a resistor 410. The resistor 410 is connected on the other side to an inductance 412 and to a drain terminal of the transistor 414. The inductance 412 is connected on the other side to the control voltage Vc. The drain terminal of transistor 414 is connected to a capacitance 418. The source terminal of transistor 414 is connected to a resistor 420 and to a capacitance 422. The resistor 420 and the capacitance 422 are connected on the other side to ground. The other side of the delay line 424 is connected to a capacitance 426. The other side of the capacitance 426 is connected to the other side of the capacitance 418 and to an output terminal 428. The transistor 414 is a B-class amplifier. The resistor 420 is used to control the AM and the PM rate.

Figure 27:
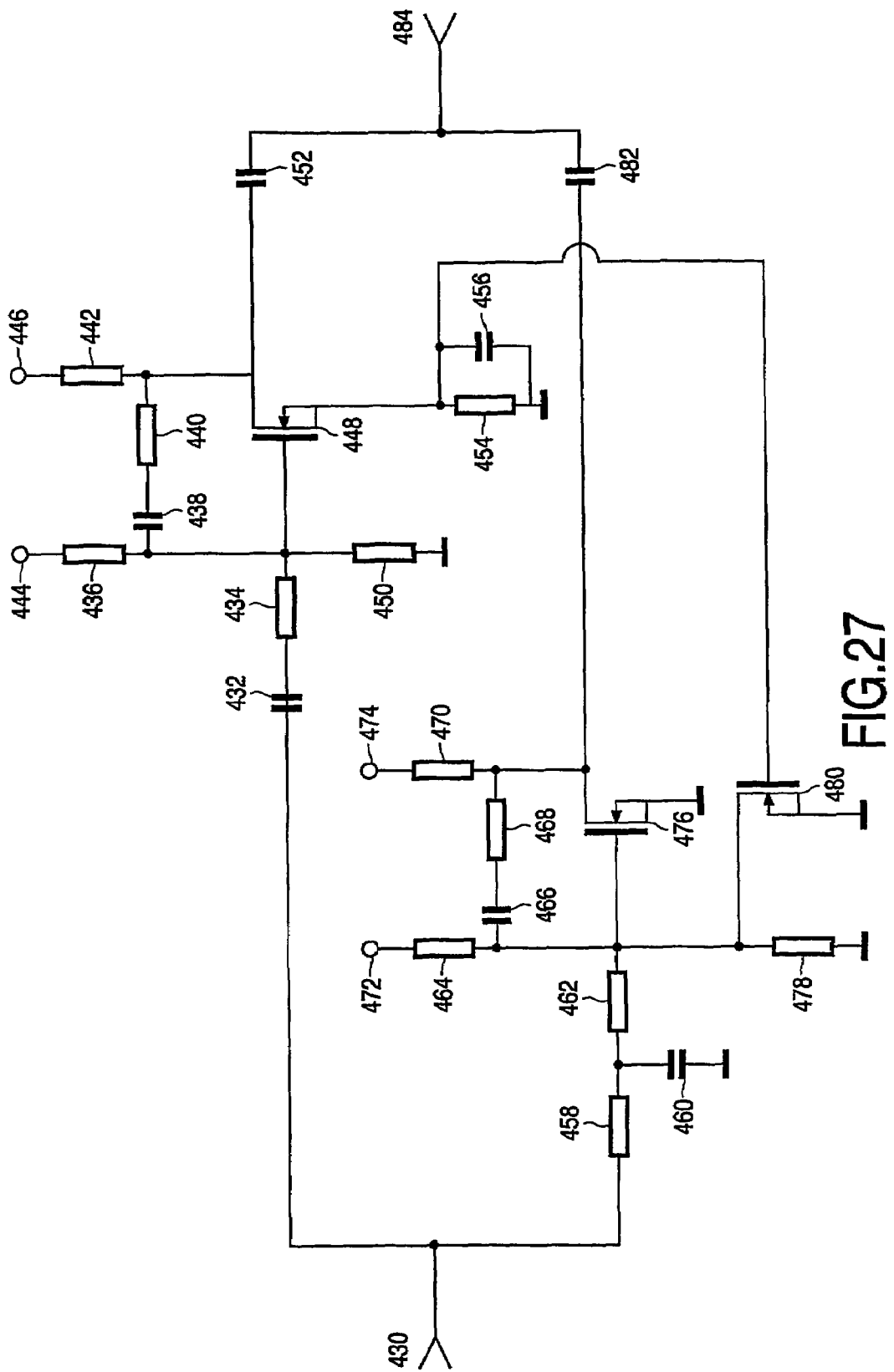

The embodiment of FIG. 27 comprises an input terminal 430 connected to a capacitance 432 and to a resistor 458. The capacitance 432 is connected to a resistor 434. The other side of the resistor 434 is connected to a resistor 436, a capacitance 438, a gate terminal of a transistor 448 and a resistor 450. The resistor 450 is connected on the other side to ground. The resistor 436 is connected on the other side to a terminal 444 which provides a threshold control signal. The capacitance 438 is connected on the other side to a resistor 440. The resistor 440 is connected on the other side to a resistor 442, a drain terminal of transistor 448 and to a capacitance 452. The other side of the resistor 442 is connected to a terminal 446 providing a supply voltage. The other side of the capacitance 452 is connected to an output terminal 484. A source terminal of transistor 448 is connected to a resistor 454 and to a capacitance 456. The other side of the resistor 454 and the capacitance 456 is connected to ground. The other side of the resistor 458 is connected to a capacitance 460 and to a resistance 462. The other side of the capacitance 460 is connected to ground. The other side of the resistor 462 is connected to a resistor 464, a capacitance 466, a gate terminal of a transistor 476, a resistor 478 and to a drain terminal of a transistor 480. The other side of the resistor 478 is connected to ground. The other side of the resistor 464 is connected to a terminal 472. The terminal 472 provides a threshold control signal. The other side of the capacitance 466 is connected to a resistor 468. The resistor 468 is connected on the other side to a resistor 470, a drain terminal of the transistor 476 and to a capacitance 482. The other side of the resistor 470 is connected to a terminal 474 providing a supply voltage. The source terminal of transistor 476 is connected to ground. A source terminal of transistor 480 is connected to ground. A gate terminal of transistor 480 is connected to the resistor 454 and to the capacitance 456. The other side of the capacitance 482 is connected to the output terminal 484. The transistor 448 is a B-class amplifier. The resistor 454 is a drain current sensor. The transistor 476 is an A-class amplifier.

Figure 28:
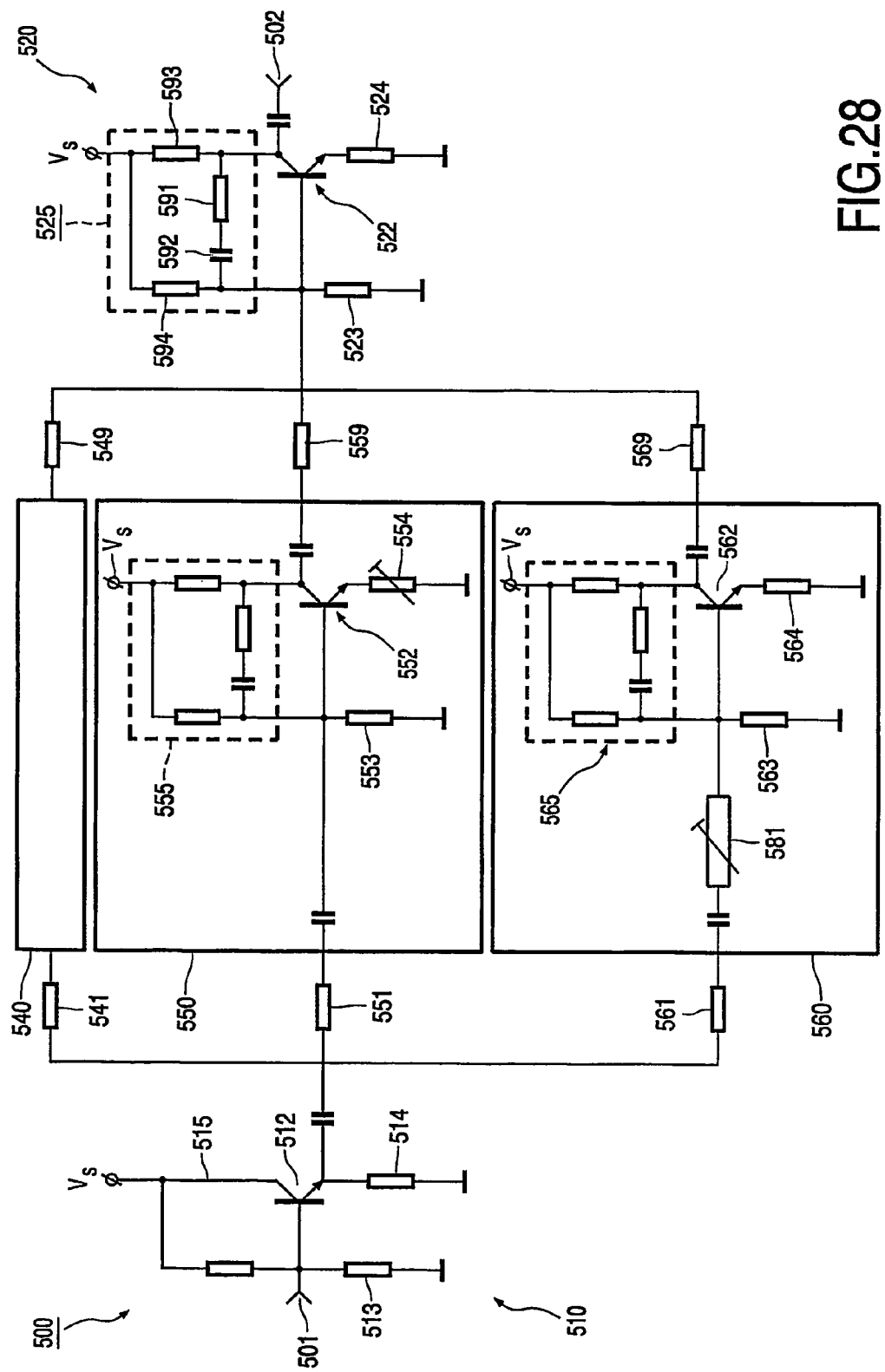

FIG. 28 shows a further alternative embodiment of the device 500 of the invention. The device 500 is provided with an input terminal 501 and an output terminal 502, and with a power distributing circuit 510, a power combining circuit 520, a linear branch 540 and non-linear branches 550, 560. Each of the branches is provided with an input impedance 541, 551, 561 and an output impedance 549, 559, 569, that have a value of for instance 30 Ohm, 30 Ohm and 70 Ohm respectively. The second non-linear branch 560 is provided with a delay line 581, that acts as a AM/PM control. The non-linear branches 550, 560, the power distributing circuit 510, and the power combining circuit 520 are all implemented, in this specific embodiment as amplifiers including a transistor 512, 522, 552, 562; a resistor 514, 524, 554, 564 connected to the output of the transistor; a resistor 513, 523, 553, 563 connected to the input of the transistor, and a feedback loop 515, 525, 555, 565. In the first non-linear brach 550 the resistor 554 is embedded as an adjustable impedance, which is suitable for use as AM-AM control. The feedback 525 in the power combining circuit and also those in the non-linear branches 550, 560 are herin embodied as double negative feedback: a first feedback passes resistor 591 and capacitor 592; a second feedback passes the control voltage input, and two resistors 593, 594. As the skilled person will understand these feedbacks may be implemented differently.

As a consequence of the feedback loop 525, the input impedance of the power combining circuit 520 is low. This, in combination with the output impedances 549, 559, 569 of the different branches assures that there is a good isolation between the branches, and results in a high gain of the amplifier 522 in the combiner circuit 520. The complete circuit can be realized with amplifiers that may be discrete products or could be embedded in an integrated circuit.

The embodiments of the present invention provide an amplification element inside the parallel branch-circuits, which radically increases the AM/AM and AM/PM expansion rate and provides the isolation between the said parallel branch-circuits outputs when combined, which helps for independent tuning and adjustment of said parallel branch-circuits parameters. The embodiments of the present invention also provide a solution for controlling the threshold power level, such as anti-parallel diodes with independent biasing and an A-class amplifier, or B/C-class amplifier with controlled bias in one independent nonlinear branch-circuit, where the threshold level, the input power level, above which the amplitude and phase transfer characteristics of the predistortion unit start to be changed, can be adjusted by one control branched signal through one special port.

The embodiments of the present invention provide an additional port for the threshold regulation; an amplifier, A- and B-Class, which significantly improves AM/AM regulation rate, which is particularly important for the multistage power amplifier compensation; introduction of more than one nonlinear branch-circuit; the embodiments of the present invention are not limited to the only microwave circuitry; the non linear elements are not limited to just Shottky and PIN diodes, but include also other circuit elements such as transistors as a resistive element; and introduction of filters, for harmonic level control.

An ideal predistortion linearizer can be applied together with different power amplifiers; i.e. it need not to be adapted if one power amplifier is replaced by another power amplifier. The proposed solution to realize this, is the use of a linearizer with at least two parallel branch-circuits, at least one linear, the others nonlinear, the nonlinear branch-circuit comprising an impedance and an amplifier, the linear branch-circuit comprising an impedance and optionally an amplifier. The nonlinear branch-circuit can be split into a plurality of nonlinear branch-circuits.

The amplifier of the linearizer has the following functions. It is operated as a diode, to block a reflection of the branched signal at a possible mismatch between the variable output resistance of the linear circuit and the non-variable resistance of the switch thereafter; generating a harmonic signal that is opposed to the harmonic signal of the power amplifier; provision of a modification of the branched signal of certain traps within the power amplifier, which modification is in phase with the branched signal. Usually the branched signals are somewhat out of phase, leading to a smoothing of the gain curve due to saturation effects. This is particularly of importance if various nonlinear circuits are provided. Due to the presence of the amplifier in the linearizer, the circuits can be adapted independently of each other. The use of amplifiers is furthermore advantageous, since they can be integrated easily (instead of the diodes), therewith reducing the amount of assembly. The parallel placements of the circuits has the function that phase and amplitude are separated.

The linearizer cancels more than 20 dB of the third-order intermodulation. This third-order intermodulation is very important for wider bands, such as wideband CDMA and EDGE. The linearizer is very suitable for use in combination with a multistage power amplifier. The linearizer can be used for a variety of power amplifiers due to relatively independent adjustability of the three key parameters such as AM/AM, AM/PM and threshold power.

New characteristics and advantages of the invention covered by this document have been set forth in the foregoing description. It will be understood, however, that this disclosure is, in many respects, only illustrative. Changes may be made in details, particularly in matters of shape, size, and arrangement of parts, without exceeding the scope of the invention. The scope of the invention is, of course, defined in the language in which the appended claims are expressed.

The invention claimed is:

1. A method for a predistortion linearization of a branched signal for a RF amplifier, comprising:
supplying an input signal to at least one input terminal;
distributing the input signal present on the at least one input terminal to a plurality of parallel branch-circuits as branched signals by a power distributing circuit;
controlling a phase parameter and an amplitude parameter of a first one of the branched signals by at least one nonlinear branch-circuit of the plurality of parallel branch-circuits;
controlling a phase parameter and an amplitude parameter of a second one of the branched signals by at least one linear branch-circuit of the plurality of parallel branch-circuits;
combining output signals of the at least one nonlinear branch-circuit with output signals of the at least one linear branch-circuit by a power combining circuit; and
providing a final output signal of a predistortion unit from the power combining circuit on at least one output terminal,
wherein the phase parameter of the first branched signal is controlled using at least one phase control unit, and wherein the amplitude parameter of the first branched signal is controlled using at least one linear amplitude control unit and at least one nonlinear amplitude control unit.

2. The method of claim 1, wherein the controlling of a phase parameter and an amplitude parameter of a second one of the branched signals by at least one linear branch-circuit of the plurality of parallel branch-circuits comprises:
at least one of controlling the phase parameter of the second branched signal using at least one phase control unit and;
controlling the amplitude parameter of the second branched signal using at least one linear amplitude control unit.

3. The method of claim 1, wherein at least one of the at least one linear amplitude control unit and the at least one nonlinear amplitude control unit is controlled depending on a power level of an input signal.

4. The method of claim 1, wherein at least one of the at least one linear amplitude control unit and the at least one nonlinear amplitude control unit is controlled depending on an external adjustable value.

5. The method of claim 1, wherein the at least one linear branch-circuit and/or the at least one nonlinear branch-circuit have their/its own specific RF power level from which their/its predistortion of amplitude and/or phase starts, which is defined by an individual nonlinear function.

6. A method for a predistortion linearization, in particular compensation of temperature of a linearized power module, where an element having a variable capacitance is a controlled element of an AM/AM compensation loop and an amplifier control element for AM/PM compensation, comprising:

supplying an input signal to at least one input terminal;

distributing the input signal present on the at least one input terminal to a plurality of parallel branch-circuits as branched signals by a power distributing circuit;

controlling a phase parameter and an amplitude parameter of a first one of the branched signals by at least one nonlinear branch-circuit of the plurality of parallel branch-circuits;

controlling at least one of a phase parameter and an amplitude parameter of a second one of the branched signals by at least one linear branch-circuit of the plurality of parallel branch-circuits;

combining an output signal of the at least one nonlinear branch-circuit with an output signal of the at least one linear branch-circuit by a power combining circuit; and providing a final output signal of a predistortion unit from the power combining circuit on at least one output terminal, wherein the phase parameter of the first branched signal is controlled using at least one phase control unit, and wherein the amplitude parameter of the first branched signal is controlled using at least one linear amplitude control unit and at least one nonlinear amplitude control unit.

7. An electronic device comprising a circuit for a predistortion unit linearizing a signal for a RF amplifier, comprising:

at least one input terminal supplying an input signal;

a power distributing circuit distributing the input signal present on the at least one input terminal to a plurality of parallel branch-circuits as branched signals;

at least one nonlinear branch-circuit of the plurality of parallel branch-circuits controlling a phase parameter and an amplitude parameter of a first one of the branched signals, the at least one nonlinear branch-circuit including at least one phase control unit controlling the phase parameter of the first branched signal, at least one linear amplitude control unit controlling the amplitude parameter of the first branched signal, and at least one nonlinear amplitude control unit controlling the amplitude parameter of the first branched signal;

at least one linear branch-circuit of the plurality of parallel branch-circuits controlling at least one of a phase parameter and an amplitude parameter of a second one of the branched signals;

a power combining circuit combining output signals of the at least one nonlinear branch-circuit with output signals of the at least one linear branch-circuit; and at least one output terminal providing an output signal of the predistortion unit from the power combining circuit.

8. The device of claim 7, wherein the at least one linear branch-circuit comprises:

at least one phase control unit controlling the phase parameter of the second branched signal and/or;

at least one linear amplitude control unit controlling the amplitude parameter of the second branched signal.

9. The device of claim 7, wherein the at least one nonlinear amplitude control unit comprises at least one nonlinear element and at least one amplifier.

10. The device of claim 8, wherein the at least one linear amplitude control unit comprises at least one of a gain control amplifier, an attenuator, a resistor, a dissipative transmission line and a controllable resistive component.

11. The device of claim 7, wherein at least one of the at least one linear and the at least one nonlinear branch-circuits have a filtering circuit at an output terminal.

12. The device of claim 8, wherein the at least one phase control unit comprises at least one transmission line or at least one controlled resistive element.

13. The device of claim 7, wherein the circuit is integrated with a semiconductor device.

* * * * *